(12) United States Patent
Eikyu et al.

(10) Patent No.: US 10,923,422 B2
(45) Date of Patent: Feb. 16, 2021

(54) SEMICONDUCTOR DEVICE

(71) Applicant: RENESAS ELECTRONICS CORPORATION, Tokyo (JP)

(72) Inventors: Katsumi Eikyu, Tokyo (JP); Fumihito Ota, Ibaraki (JP); Takashi Ipposhi, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/444,823

(22) Filed: Jun. 18, 2019

(65) Prior Publication Data

US 2019/0393169 A1    Dec. 26, 2019

(30) Foreign Application Priority Data

Jun. 25, 2018  (JP) .............................. JP2018-119615

(51) Int. Cl.
*H01L 23/528*  (2006.01)
*H01L 23/00*  (2006.01)
*H01L 23/522*  (2006.01)

(52) U.S. Cl.
CPC ...... *H01L 23/5283* (2013.01); *H01L 23/5226* (2013.01); *H01L 23/562* (2013.01); *H01L 2225/06544* (2013.01)

(58) Field of Classification Search
CPC ....... H01L 23/48; H01L 23/481; H01L 23/52; H01L 23/522; H01L 23/5226; H01L 23/528; H01L 23/5283; H01L 23/535; H01L 24/80; H01L 24/82; H01L 2225/06541; H01L 2225/06544; H01L 2225/06548; H01L 2224/03011; H01L 2224/11011; H01L 2224/27011
See application file for complete search history.

(56) References Cited

U.S. PATENT DOCUMENTS

| | | | |
|---|---|---|---|
| 7,199,042 B2 | 4/2007 | Ozawa | |
| 9,698,096 B2* | 7/2017 | Hirano | H01L 23/5329 |
| 10,381,369 B2* | 8/2019 | Kim | H01L 29/7926 |
| 2005/0167842 A1* | 8/2005 | Nakamura | H01L 23/522 257/758 |
| 2006/0289997 A1* | 12/2006 | Tomita | H01L 23/5283 257/758 |
| 2008/0237870 A1* | 10/2008 | Nakao | H01L 23/522 257/758 |

(Continued)

FOREIGN PATENT DOCUMENTS

JP   2005-142351 A   6/2005

*Primary Examiner* — Eduardo A Rodela
(74) *Attorney, Agent, or Firm* — McDermott Will & Emery LLP

(57) ABSTRACT

The semiconductor device SD1a includes a first wiring M2 and a second wiring M3.
The semiconductor device includes a first conductor pattern DM, a first via V2 in contact with the first wiring M2 and the second wiring M3, and a second via DV1,DV2,DV3,DV4 in contact with the first conductor pattern DM and the second wiring M3.
In plan view, the distance between the second via DV1 closest to the corner portion CI of the second wire M3 and the corner portion CI is shorter than the distance between the first via V2 and the corner portion CI, and the distance between the second vias adjacent to each other is shorter than the distance between the second via DV3 closest to the first via V2 and the first via V2.

6 Claims, 21 Drawing Sheets

(56) References Cited

U.S. PATENT DOCUMENTS

| | | | |
|---|---|---|---|
| 2009/0200676 A1* | 8/2009 | Kudo | H01L 21/76808 257/758 |
| 2010/0270686 A1* | 10/2010 | Nakao | H01L 21/7684 257/774 |
| 2011/0175232 A1* | 7/2011 | Ota | H01L 24/05 257/774 |
| 2016/0172305 A1* | 6/2016 | Sato | B82Y 10/00 257/741 |
| 2017/0005100 A1* | 1/2017 | Cho | H01L 27/10897 |
| 2017/0117290 A1* | 4/2017 | Lee | H01L 27/11582 |
| 2017/0162434 A1* | 6/2017 | Oh | H01L 21/0332 |
| 2018/0261467 A1* | 9/2018 | Matsumoto | H01L 21/768 |

* cited by examiner

SEMICONDUCTOR DEVICE

CROSS-REFERENCE TO RELATED APPLICATIONS

The disclosure of Japanese Patent Application No. 2018-119615 filed on Jun. 25, 2018 including the specification, drawings and abstract is incorporated herein by reference in its entirety.

BACKGROUND

The present invention relates to a semiconductor device, and, for example, to a technique which can be suitably applied to a semiconductor device having a wiring for causing a large current to flow.

Conventionally, in a semiconductor device, it is desired to prevent peeling between a wiring and an interlayer insulating film or peeling between interlayer insulating films.

Conventionally, in a semiconductor device, it is desired to prevent peeling between a wiring and an interlayer insulating film or peeling between interlayer insulating films.

For example, Japanese unexamined Patent Application publication No. 2005-142351 describes a semiconductor device in which a dummy wiring is formed for each interlayer insulating film and dummy wirings formed in each interlayer insulating film of an upper layer and a lower layer are connected by via plugs in order to prevent peeling of the interlayer insulating film due to stress applied to the interlayer insulating film when polishing a metal on the interlayer insulating film.

According to this technique, the laminated structure of the dummy wiring and the via plug serves as a joint of the interlayer insulating film, and peeling of the interlayer insulating film due to stress can be prevented.

SUMMARY

The inventor of the present application has studied increasing the film thickness of the wiring in order to flow a large current in the semiconductor device.

It is desired to improve the reliability of the semiconductor device by devising the structure of the semiconductor device.

Other objects and novel features will become apparent from the description of this specification and the accompanying drawings.

The semiconductor device according to the embodiment includes a first wiring and a second wiring formed in a wiring layer on one of the first wirings.

The semiconductor device has a first conductor pattern formed in the same wiring layer as the first wiring layer, a first via in contact with the first wiring and the second wiring to electrically connect the first wiring and the second wiring, and a plurality of second vias in contact with the first conductor pattern and the second wiring.

The first wiring and the second wiring are each formed in a rectangular shape in plan view, and the second wiring is thicker than the first wiring.

In plan view, the first distance between the second via closest to the first corner portion of the second wiring and the first corner portion of the plurality of second vias is shorter than the second distance between the first via and the first corner portion.

In plan view, the third distance between the second vias adjacent to each other among the plurality of second vias is shorter than the fourth distance between the second via closest to the first via among the plurality of second vias and the first via.

According to one embodiment, reliability of the semiconductor device can be improved.

BRIEF DESCRIPTION OF THE DRAWINGS

FIG. 3A is a cross-sectional view of a main part showing a structure cut along a line corresponding to the line A-A in FIG. 1, and FIG. 3B is a cross-sectional view of a main part showing a structure cut along a line corresponding to the line B-B in FIG. 1.

FIG. 4A is a cross-sectional view of the main part showing a structure cut along a line corresponding to the line A-A in FIG. 1, and FIG. 4B is a cross-sectional view of the main part showing a structure cut along a line corresponding to the line B-B in FIG. 1.

FIG. 5A is a cross-sectional view of the main part showing a structure cut along a line corresponding to the line A-A in FIG. 1, and FIG. 5B is a cross-sectional view of the main part showing a structure cut along a line corresponding to the line B-B in FIG. 1.

FIG. 6A is a cross-sectional view of the main part showing a structure cut along a line corresponding to the line A-A in FIG. 1, and FIG. 6B is a cross-sectional view of the main part showing a structure cut along a line corresponding to the line B-B in FIG. 1.

FIG. 7A is a cross-sectional view of the main part, showing a structure cut along a line corresponding to the line A-A in FIG. 1, and FIG. 7B is a cross-sectional view of the main part showing a structure cut along line corresponding to the line B-B in FIG. 1.

DETAILED DESCRIPTION

Figure 1:
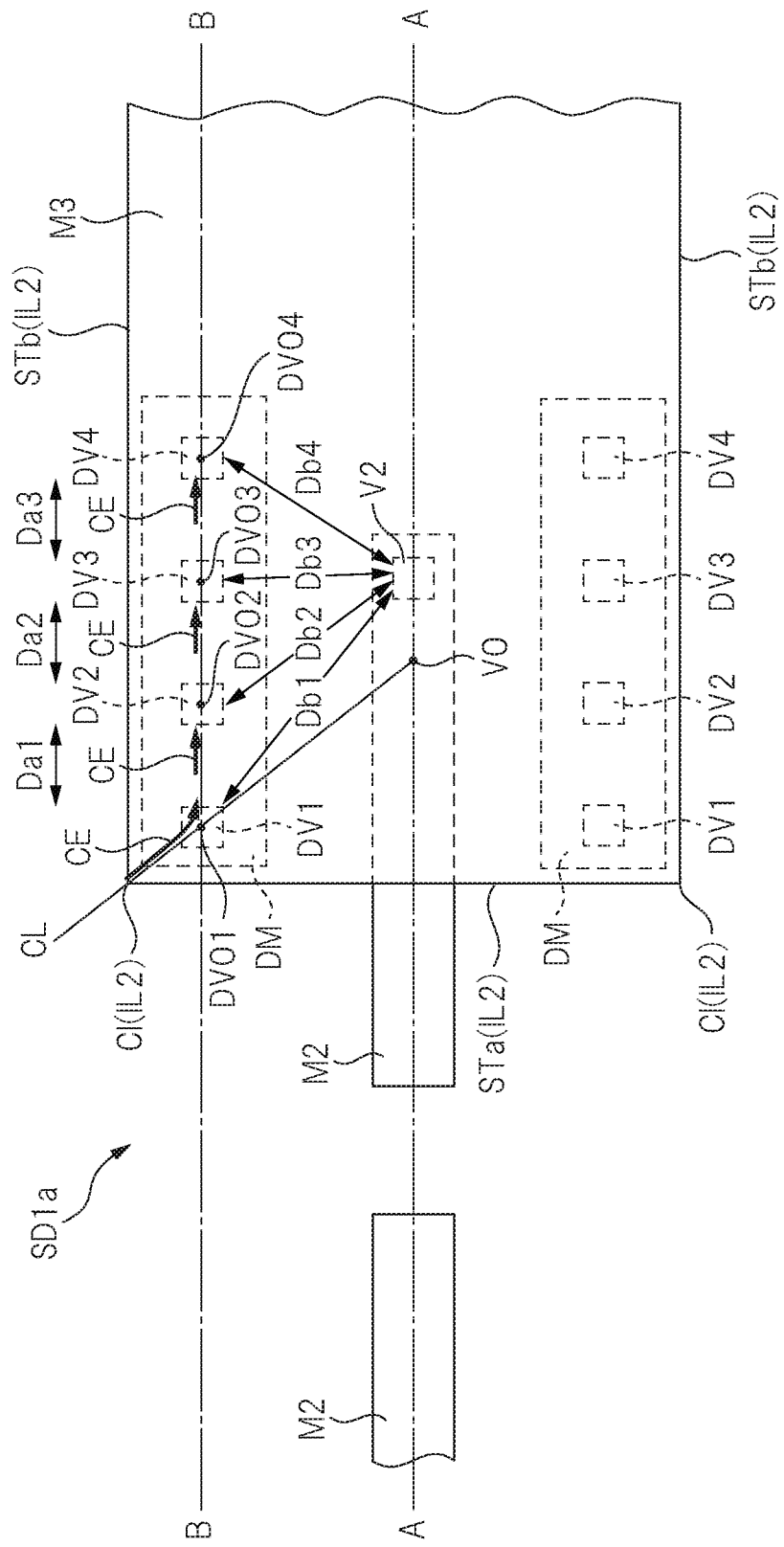
FIG. 1 is an enlarged plan view showing a semiconductor device according to an embodiment.

In the following embodiments, descriptions of the same or similar parts will not be repeated in principle except when particularly necessary.

Further, in the following embodiments, when it is necessary for convenience, the description will be made by dividing into a plurality of sections or embodiments, but except for the case where it is specifically specified, they are not independent of each other, and one of them is related to some or all of modifications, details, supplementary description, and the like of the other.

In addition, in the following embodiments, when referring to the number of elements or the like (including the number, the number, the amount, the range, and the like), the number is not limited to the specific number except the case where it is specified in particular or the case where it is clearly limited to the specific number in principle, and the number may be equal to or greater than or equal to the specific number, or may be equal to or less than the specific number.

In addition, in the following embodiments, it is needless to say that the constituent elements (including element steps and the like) are not necessarily indispensable except for the case where they are specifically specified and the case where they are considered to be obviously indispensable in principle.

In the following embodiments, it is needless to say that, with respect to the constituent elements and the like, "consisting of A," "consisting of A," "having A," and "including A" do not exclude other elements except when it is clearly indicated that the constituent elements and the like are only those elements. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, members having the same functions are denoted by the same reference numerals, and repetitive descriptions thereof are omitted. In order to make the drawings easier to understand, hatching may be added even in a plan view.

First Embodiment

A structure of a semiconductor device according to an embodiment will be described with reference to FIGS. 1 to 2. FIG. 1 is an enlarged plan view of a semiconductor device SD1a according to Embodiment 1. FIG. 2 is a cross-sectional view of a main part of the semiconductor device SD1a of the first embodiment, in which (a) is a cross-sectional view of a main part of the semiconductor device taken along line A-A of FIG. 1, and (b) is a cross-sectional view of a main part of the semiconductor device taken along line B-B of FIG. 1.

Figure 2A:
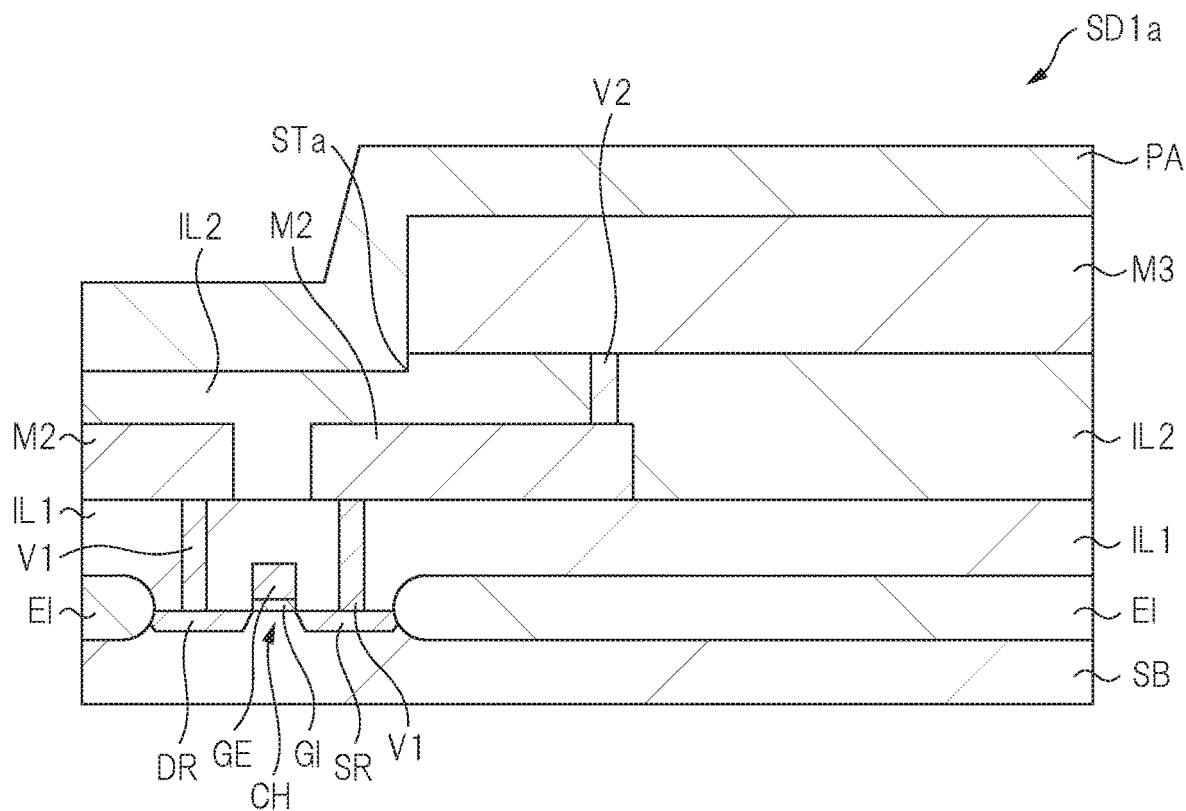
FIG. 2A is a cross-sectional view of a main part showing a structure taken along line A-A of FIG. 1.
Figure 2B:
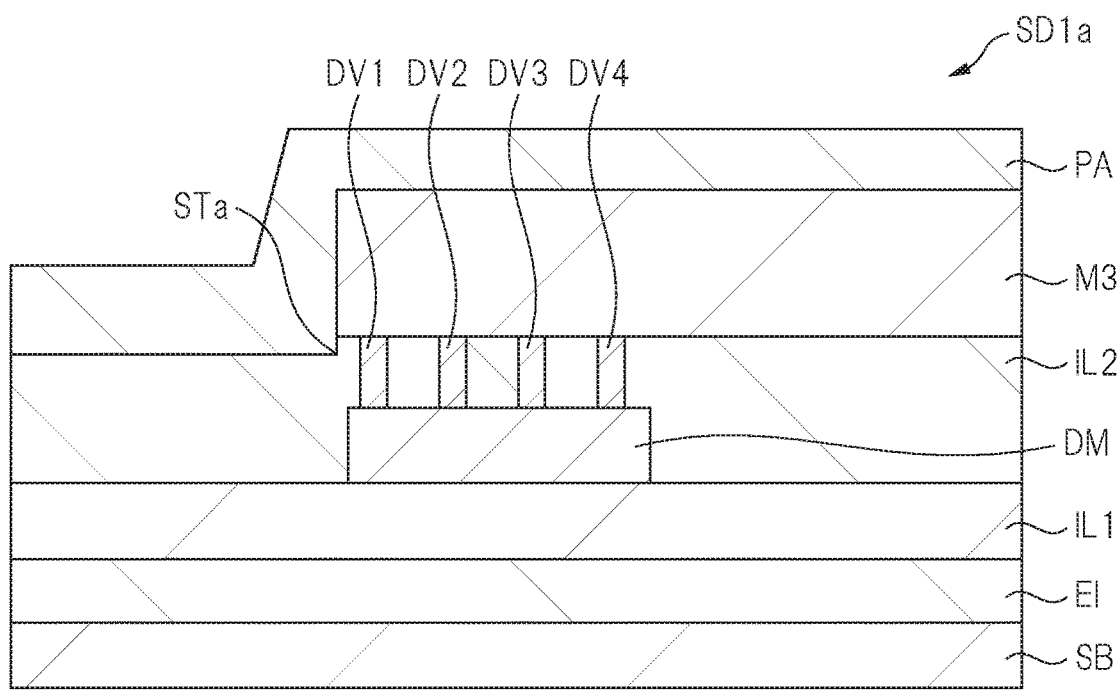
FIG. 2B is a cross-sectional view of a main part showing a structure taken along line B-B of FIG. 1 in the semiconductor device of the embodiment.

As shown in FIGS. 2A and 2B, the semiconductor device SD1a of Embodiment 1 includes a substrate (semiconductor substrate) SB. The substrate SB is made of, for example, silicon (Si). An element isolation film EI is formed on main surface of the substrate SB. The element isolation film EI is made of, for example, silicon oxide.

As shown in FIG. 2A, a MOSFET is formed as a semiconductor element in a region (active region, MOS-forming region) of the substrate SB where the element isolation film EI is not formed on the substrate SB. The MOSFET formed on the semiconductor device SD1a has a source region SR and a drain region DR formed in the substrate SB, a channel region CH formed between the source region SR and the drain region DR, a gate insulating film GI formed on the channel region CH, and gate electrodes GE formed on the gate insulating film GI. The gate insulating film GI is made of, for example, a silicon oxide film, and the gate electrode GE is made of, for example, a polysilicon film.

The semiconductor device SD1a of the first embodiment includes an insulating layer IL1 formed on the board SB so as to cover the element isolation film EI and the semiconductor element MOSFET, a wiring M2 formed on the insulating layer IL1, an insulating layer IL2 formed on the insulating layer IL1 so as to cover the wiring M2, a wiring M3 formed on the insulating layer IL2, and a protective film PA formed on the insulating layer IL2 so as to cover the wiring M3. The thickness of the wiring M3 is larger than the thickness of the wiring M2.

The insulating layer IL1, IL2 is made of, for example, a silicon oxide layer. The wirings M2 and M3 are made of a material containing aluminum (Al) as a main component, and are made of, for example, an aluminum (Al) film. The protective film PA is made of, for example, a silicon oxide film. Although not shown, the wirings M2 and M3 may have, for example, a laminated structure in which a laminated film of a titanium film and a titanium nitride film or the like is disposed under the aluminum film, or may have a laminated structure in which a laminated film of a titanium film and a titanium nitride film is also disposed above the aluminum film.

As shown in FIG. 2B, in the semiconductor device SD1a of the first embodiment, dummy wirings (first conductive patterns) are formed on the insulating layers IL1 in regions where the device isolation films EI are formed on the substrate SB. The wiring M2 and the dummy wiring DM are formed in the same layer.

As shown in FIG. 2A, a through hole (through hole) is formed in the insulating layer IL1, and conductive vias (plugs) V1 are buried in the through hole. The via V1 is disposed between the wiring M2 and the source region SR of the MOSFET and between the wiring M2 and the drain region DR of the MOSFET, and electrically connects the wiring M2 and the source region SR, and electrically connects the wiring M2 and the drain region DR, respectively.

As shown in FIGS. 2A and 2B, a through hole is formed in the insulating layer IL2, and a conductive via (plug) V2 and a dummy via (dummy plug) DV1, DV2, DV3, DV4 are buried in the through hole. The via V2 is disposed between the wiring M3 and the wiring M2, and electrically connects the wiring M3 and the wiring M2 by contacting the lower surface of the wiring M3 and the upper surface of the wiring M2, respectively. The dummy via DV1, DV2, DV3, DV4 is disposed between the wiring M3 and the dummy wiring DM, and contacts the bottom surface of the wiring M3 and the dummy wiring DM2. The vias V1 and V2 and the dummy via DV1, DV2, DV3, DV4 are made of, for example, a tungsten (W) film. Steps STa and STb are formed on the insulating layers IL2. As shown in FIG. 1, in plan view, the stepped portion STa is located at the end in the length direction of the wiring M3, and the stepped portion STb is located at the end in the width direction of the wiring M3. In plan view, a point at which a straight line passing through the step portion STa and a straight line passing through the step portion STb intersect coincides with a corner portion (first corner portion and second corner portion) CI of the wiring M3.

FIG. 1 shows an enlarged plan view in which other members are omitted to represent the planar arrangement of the wiring M2, M3, dummy wiring DM, via V2 and dummy via DV1, DV2, DV3, DV4 in the semiconductor device SD1a of the first embodiment.

As shown in FIG. 1, in plan view, the wirings M2 and M3 are each formed in a rectangular shape. The width of the wiring M3 is larger than the width of the wiring M2. The length direction of the wiring M2 coincides with the length direction of the wiring M3. In plan view, the wiring M2 is arranged at the center in the width direction of the wiring M3. In particular, in plan view, the center of the wiring M2 in the width direction coincides with the center of the wiring M3 in the width direction. The via V2 is disposed at one end in the longitudinal direction of the wiring M2.

In the semiconductor device SD1a of the first embodiment, in plan view, dummy wirings DM are formed at both ends in the width direction of the wiring M3 along the length direction of the wiring M3. As described above, a set of dummy vias DV1, DV2, DV3, DV4 are arranged so as to respectively contact the bottom surface of the wiring M3 and the top surface of the dummy wiring DM. Since the dummy wirings DM and the dummy vias DV1, DV2, DV3, DV4 are symmetrically arranged across a straight line (A-A line) passing through the center of the widthwise direction of the wirings M3, one of the dummy wirings DM and the dummy vias DV1, DV2, DV3, DV4 will be exemplified below.

In plan view, the dummy wiring DM is formed in a rectangular shape. The length direction of the dummy wiring DM coincides with the length direction of the wirings M2 and M3. The width of the dummy wiring DM is smaller than the width of the wiring M3 and equal to or larger than the width of the wiring M2.

The dummy vias DV1, DV2, DV3, DV4 are arranged along the length of the dummy wirings DM. That is, the center DVO1 of the dummy via DV1, the center DVO2 of the dummy via DV2, the center DVO3 of the dummy via DV3, and the center DVO4 of the dummy via DV4 are aligned on a straight line (on the line B-B).

Further, in plan view, the via V2 is not on the straight-line CL passing through the corner portion CI and the center DVO1 of the dummy via DV1. That is, when the point where the straight line (A-A line) passing through the center in the width direction of the wiring M2 and the straight line CL intersect is VO, the center of the via V2 does not coincide with the point VO.

The dummy via DV1 is closest to the corner portion CI in the dummy via DV1, DV2, DV3, DV4. The dummy via DV4 is farthest from the corner portion CIs in the dummy via DV1, DV2, DV3, DV4.

Here, in plan view, the distance (third distance, eighth distance) between the dummy via DV1 and the dummy via DV2 is defined as Da1, the distance (third distance, eighth distance) between the dummy via DV2 and the dummy via DV3 is defined as Da2, and the distance (third distance, eighth distance) between the dummy via DV3 and the dummy via DV4 is defined as Da3. In plan view, the distance between the dummy via DV1 and the via V2 is Db1, the distance between the dummy via DV1 and the via V2 is Db1, the distance between the dummy via DV1 and the via V2 is Db1, the distance between the dummy via DV2 and the via V2 is Db2, the distance between the dummy via DV3 and the via V2 is Db3, and the distance between the dummy via DV4 and the via V2 is Db4. At this time, the distance Dai (distance Da1, Da2, Da3) between adjacent dummy vias is shorter than the distance Db3 (fourth distance, ninth distance) between the dummy vias closest to the via V2. That is, the distance Dai (distance Da1, Da2, Da3) between adjacent dummy vias is shorter than any distance Dbi (distance Db1, Db2, Db3, Db4) between the via V2 and the dummy via. In plan view, the distance (first distance, sixth distance) between the dummy via DV1 and the corner portion CI is shorter than the distance (second distance, seventh distance) between the via V2 and the corner portion CI. The distance between the dummy via DV4 and the corner portion CI is longer than the distance between the via V2 and the corner portion CI.

The width of the wiring M2 is, for example, 0.6 μm, and the width of the wiring M3 is, for example, 4 μm. The film thickness of the wiring M2 is, for example, 0.2 to 0.5 μm, and the film thickness of the wiring M3 is, for example, 2 to 4 μm. The thickness of the insulating IL1, IL2 is, for example, 0.6 μm to 1.3 μm.

Although the dummy wiring DM is referred to as a dummy wiring DM for convenience of illustration as a conductor pattern different from the wiring M2, the dummy wiring DM may be a conductor pattern used as the wiring DM. The dummy via DV1, DV2, DV3, DV4 is referred to as a dummy via DV1, DV2, DV3, DV4 for convenience of illustration as a via that differs from the via V2. However, the dummy wiring DM may be used as an actual wiring, and the dummy via DV1, DV2, DV3, DV4 may also be used as an actual via. That is, when the dummy wiring DM is used as the wiring DM, the dummy via DV1, DV2, DV3, DV4 may be used as a via DV1, DV2, DV3, DV4 for electrically connecting the wiring DM and the wiring M3. The dummy wiring DM may be electrically connected to other wirings other than the wiring M2.

Although not particularly illustrated, another wiring layer may be formed below the wiring M2 or above the wiring M3. The pad electrode may be formed in the same layer as the wiring M3 or in a layer above the wiring M3.

A method of manufacturing the semiconductor device SD1a of the first embodiment will be described in order of steps with reference to FIGS. 3A, 3B, 4A, 4B, 5A, 5B, 6A, 6B, 7A, and 7B FIGS. 3A, 4A, 5A, 6A, and 7A are cross-sectional views of main parts in the manufacturing process of the semiconductor device SD1a of the first embodiment, showing structures cut along the line corresponding to the line A-A in FIG. 1. FIGS. 3B, 4B, 5B, 6B, and 7B are cross-sectional views of main parts in the manufacturing process of the semiconductor device SD1a of the first embodiment, showing structures cut along the line corresponding to the line B-B in FIG. 1.

Figure 3A:
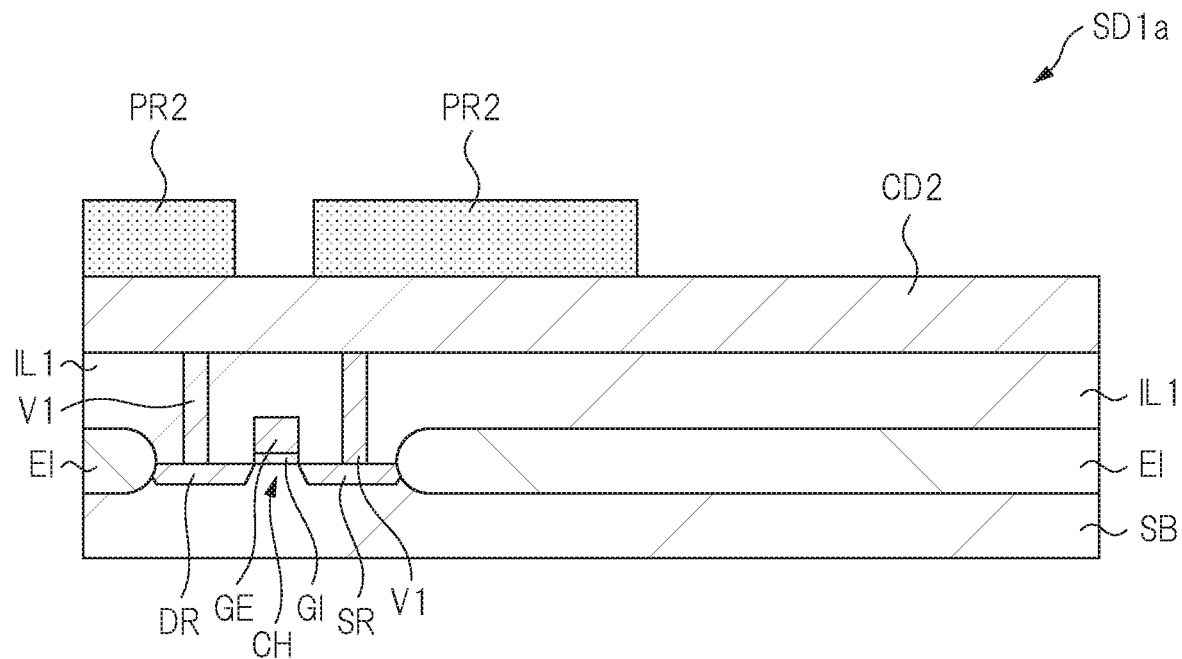
FIGS. 3A and 3B are cross-sectional views of a main part during a manufacturing process of the semiconductor device according to the embodiment.
Figure 3B:
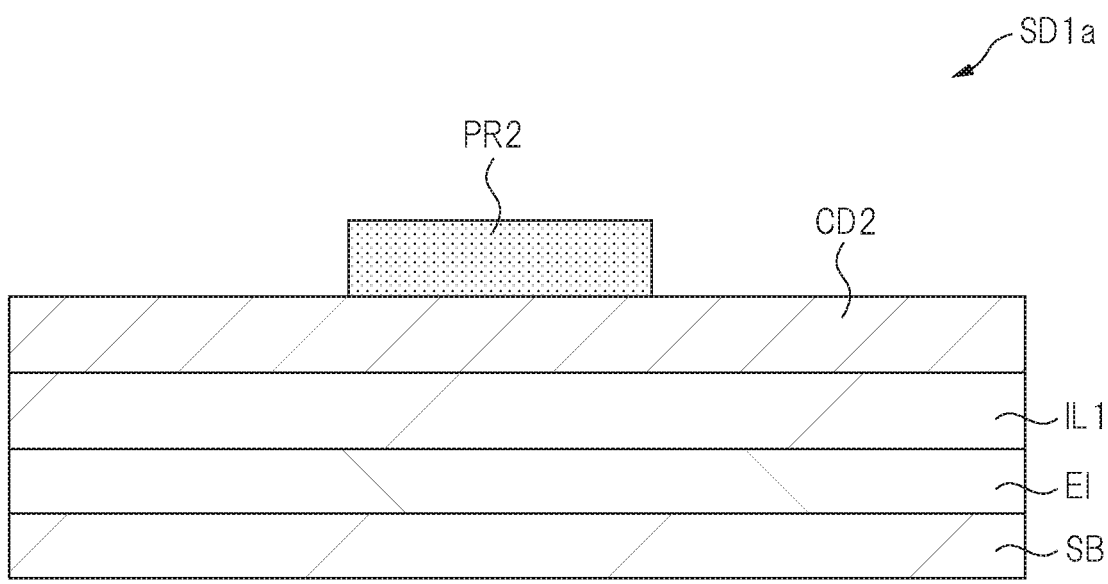

As shown in FIGS. 3A and 3B, a substrate SB is prepared. A silicon wafer, for example, is used as the substrate SB. First, an isolation film EI as an insulating film is formed on the main surface of the substrate SB by, for example, the LOCOS (Local Oxidization of Silicon) method. Next, after a silicon oxide film is formed by thermally oxidizing a region of the substrate SB where the element isolation film EI is not formed, i.e., an active region and a MOS formation region, for example, a polysilicon film is formed on the active region. The polysilicon film and the silicon oxide film are patterned by photolithography and dry etching to form MOSFET gate electrodes GE and gate insulating films GI. Further, a p-type (or n-type) impurity (dopant) is ion-implanted into the substrate SB by self-alignment using the gate electrode GE and the element isolation film EI as a mask. Thereafter, an impurity is diffused by heat treatment to form a MOSFET source region SR and a drain region DR in the substrate SB.

Next, an insulating layer IL1 made of, e.g., a silicon oxide film formed on the substrate SB by, e.g., CVD (Chemical Vapor Deposition: Chemical Vapor Deposition) method. Next, through holes are formed in the IL1 of the insulating layers by photolithography and etch. The through hole is formed to expose a part of the source region SR and a part of the drain region DR. Subsequently, a via V1 is formed by filling a tungsten film, for example, in the through hole of the insulating layer IL1.

Next, a conductive film CD2 made of, for example, aluminum is deposited on the insulating IL1 by a sputtering method or the like. Next, a photoresist pattern PR2 is formed on the conductive film CD2.

Figure 4A:
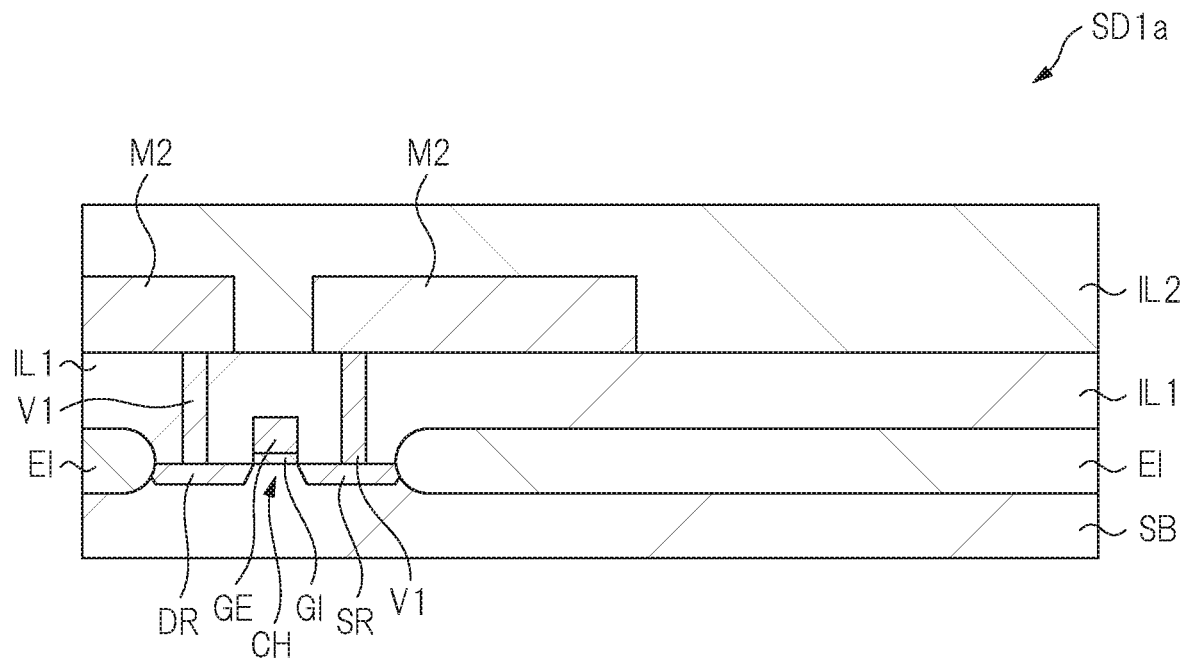
FIGS. 4A and 4B are cross-sectional views of the main part during the manufacturing process of the semiconductor device continued from FIGS. 3A and 3B.
Figure 4B:
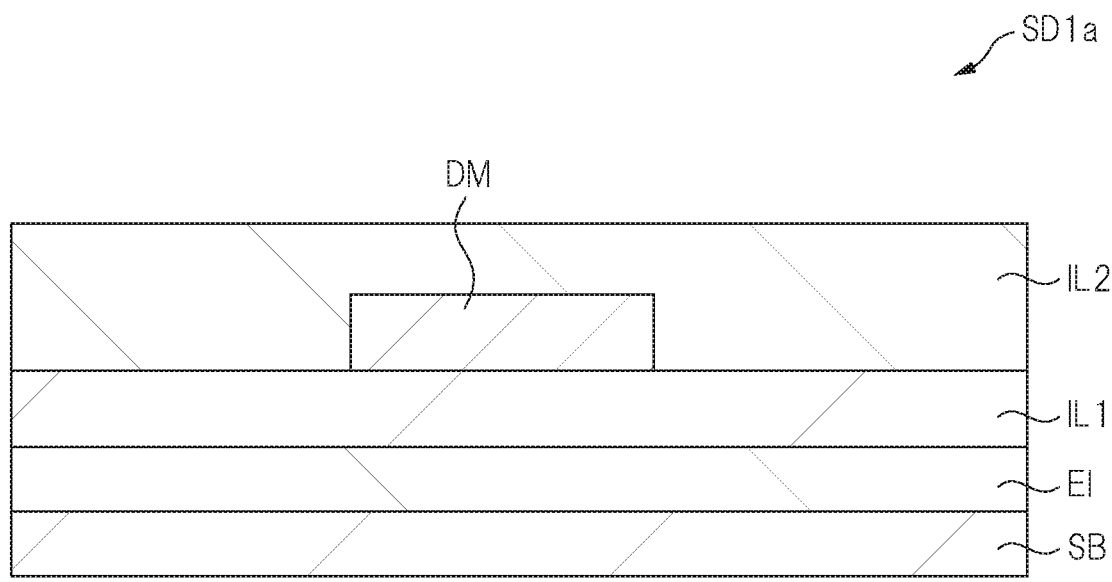

Next, as shown in FIG. 3A, using the photoresist pattern PR2 as a mask, the conductive film CD2 is etched by dry etching or the like to form a wire M2 as shown in FIG. 4A. At the same time, as shown in FIG. 3B, the conductive film CD2 is etched using the photoresist pattern PR2 as a mask to form a dummy interconnection DM2 as shown in FIG. 4B. Thereafter, the photoresist pattern PR2 is removed by ashing or the like.

Next, as shown in FIGS. 4A and 4B, an insulating layer IL2 made of, for example, a silicon oxide film is formed on the insulating layer IL1 so as to cover the wiring M2 and the dummy wiring DM2.

Figure 5A:
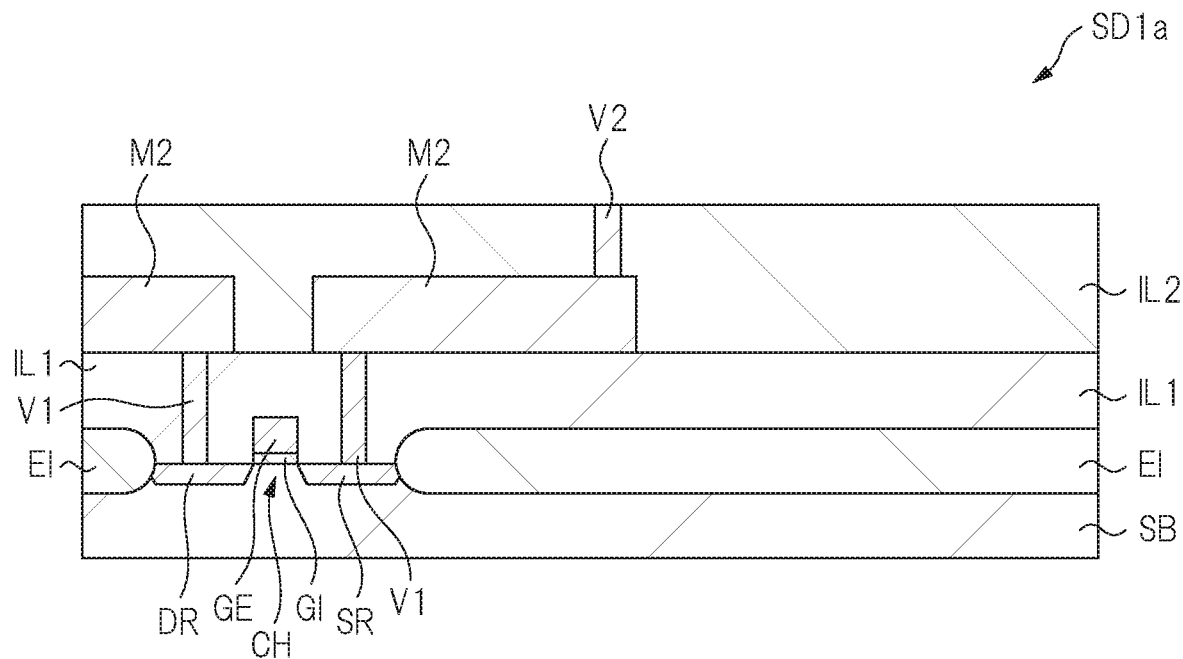
FIGS. 5A and 5B are cross-sectional views of the main part during the manufacturing process of the semiconductor device continued from FIGS. 4A and 4B.
Figure 5B:
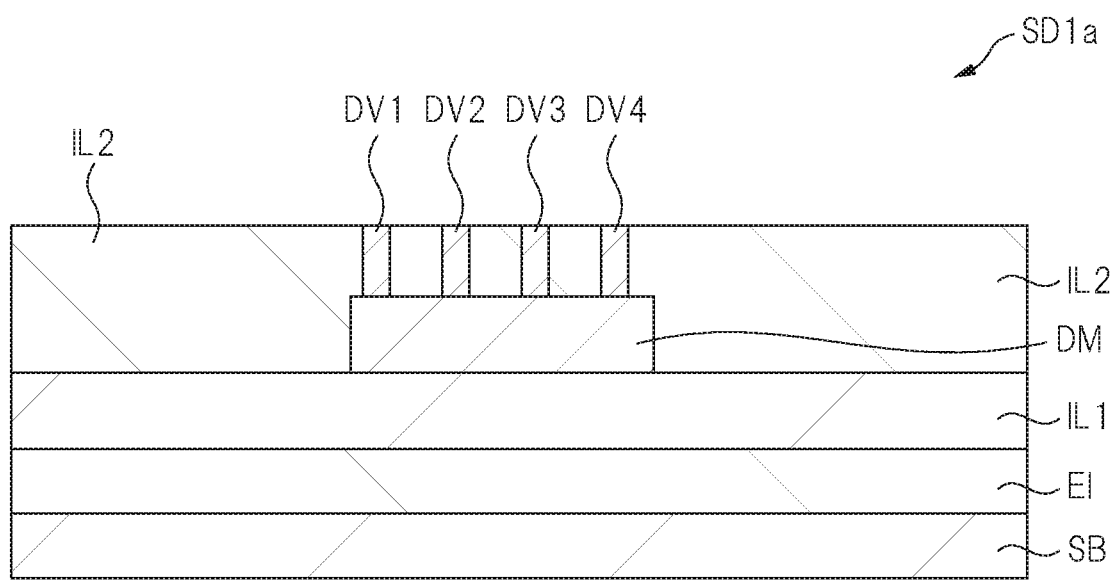

Next, as shown in FIG. 5A and FIG. 5B, through holes are formed in the IL2 of the insulating layers by photolithography and etch. The through hole is formed to expose a part of the wiring M2 and a part of the dummy wiring DM2.

Subsequently, a via V2 and a dummy via DV1, DV2, DV3, DV4 are formed by filling a tungsten film, for example, in the through hole of the insulating layer IL2.

Figure 6A:
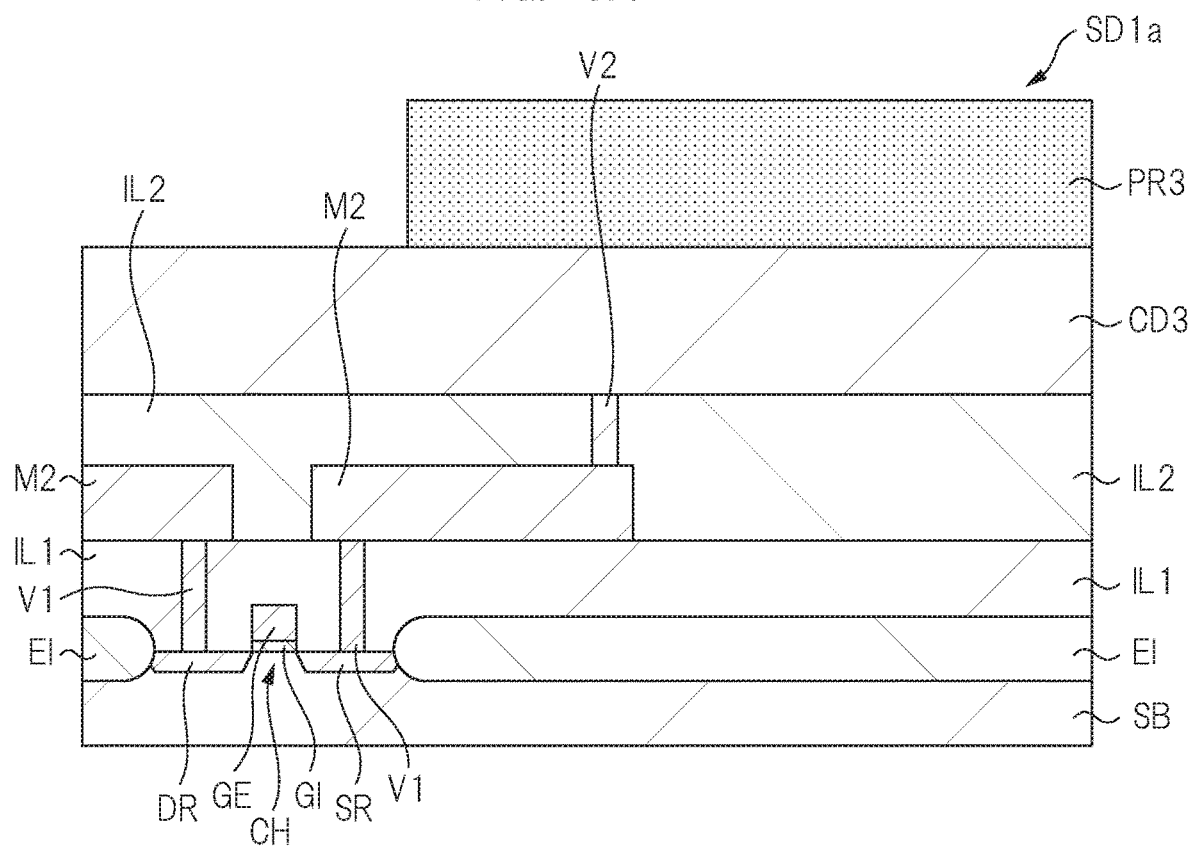
FIGS. 6A and 6B are cross-sectional views of the main part during the manufacturing process of the semiconductor device continued from FIGS. 5A and 5B.
Figure 6B:
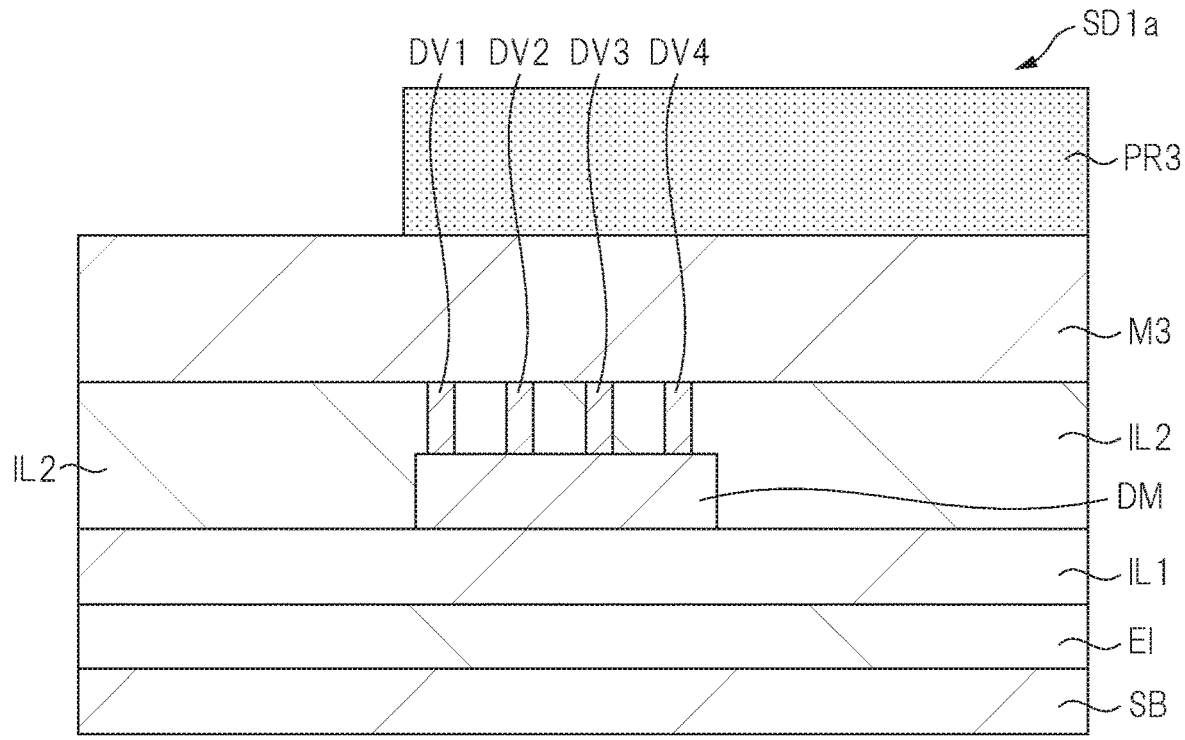

Subsequently, as shown in FIGS. 6A and 6B, a conductive film CD3 made of, for example, aluminum is deposited on the insulating film IL2 by a sputtering method or the like. Next, a photoresist pattern PR3 is formed on the conductive film CD3.

Figure 7A:
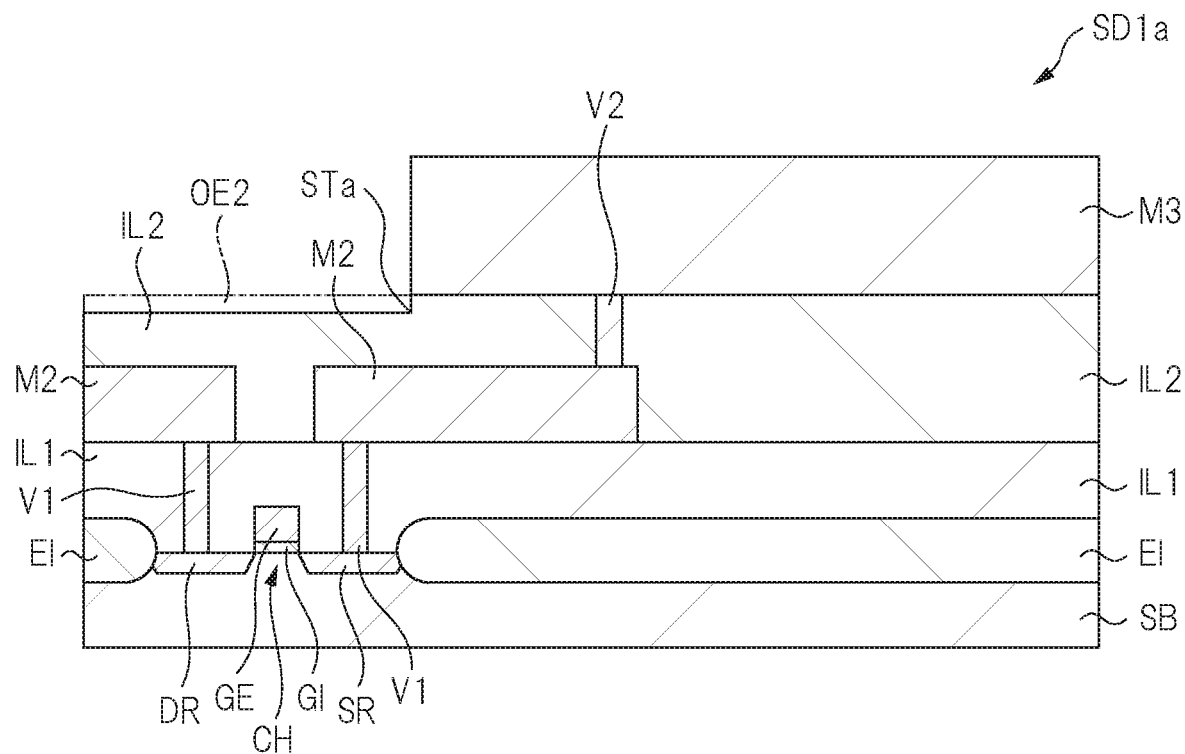
FIGS. 7A and 7B is cross-sectional views of the main part during the manufacturing process of the semiconductor device continued from FIGS. 6A and 6B.
Figure 7B:
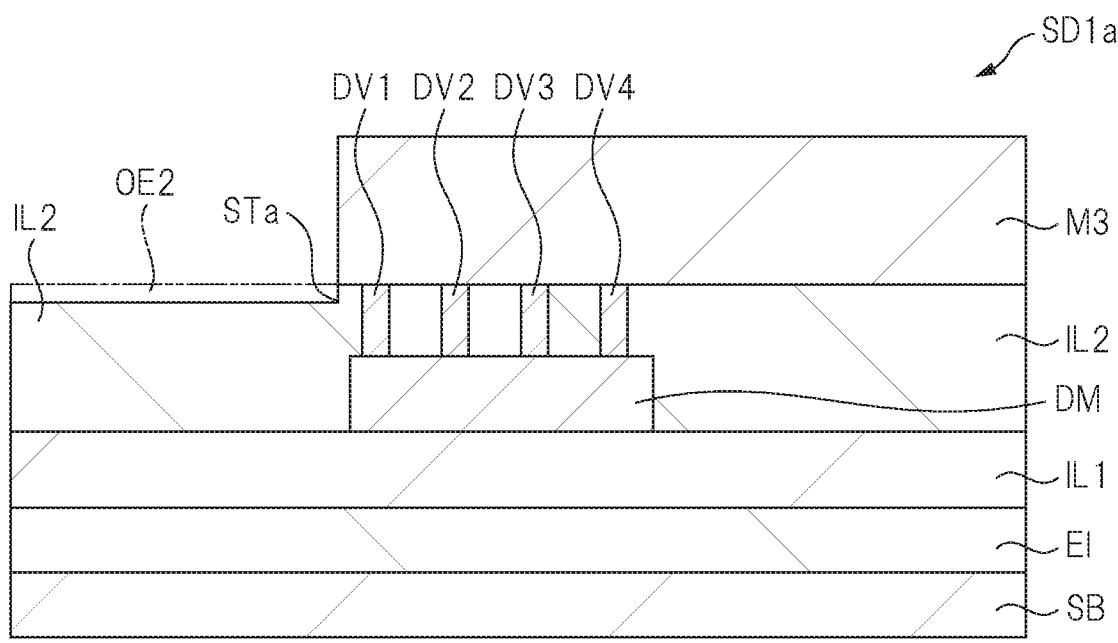

Next, using the photoresist pattern PR3 as a mask, the conductive film CD3 is etched by dry etching or the like to form wiring M3 as shown in FIGS. 7A and 7B.

At this time, over-etching is performed on the conductor film CD3 so as not to leave an etching residue on the conductor film CD3. As a result, a portion (hereinafter referred to as an over-etched portion OE2) of the conductor film CD3 is removed by over-etching in the insulating layer IL2 under the conductor film CD3 removed by etching. Therefore, the thickness of the insulating layer IL2 existing in the lower portion of the conductor film CD3 removed by the etch is smaller than the thickness of the insulating layer IL2 existing in the lower portion of the remaining conductor film CD3, that is, the interconnection M3. In other words, the height based on the insulating layer IL1 of the insulating layer IL2 existing in the lower portion of the conductor film CD3 removed by the etch is lower than the height based on the insulating layer IL1 of the insulating layer IL2 existing in the lower portion of the remaining conductor film CD3, that is, the interconnection M3. Hereinafter, the positions where the thickness (height) of the insulating layers IL2 changes are referred to as step portions STa, STb. As shown in FIG. 1, the step portion STa is a step portion formed along the width direction of the wiring M3, and the step portion STb is a step portion formed along the length direction of the wiring M3. The intersection of the step STa and the step STb coincides with the corner portion CI of the wiring M3. In plan view, the step STa of the insulating layer IL2 coincides with the end in the length direction of the wiring M3, and the step STb of the insulating layer IL2 coincides with the end in the width direction of the wiring M3.

Thereafter, the photoresist pattern PR3 is removed by ashing or the like.

Next, as shown in FIGS. 2A and 2B, a protective film PA made of, for example, a silicon oxide film is formed on the insulating layer IL2 so as to cover the interconnection M3.

Figure 8:
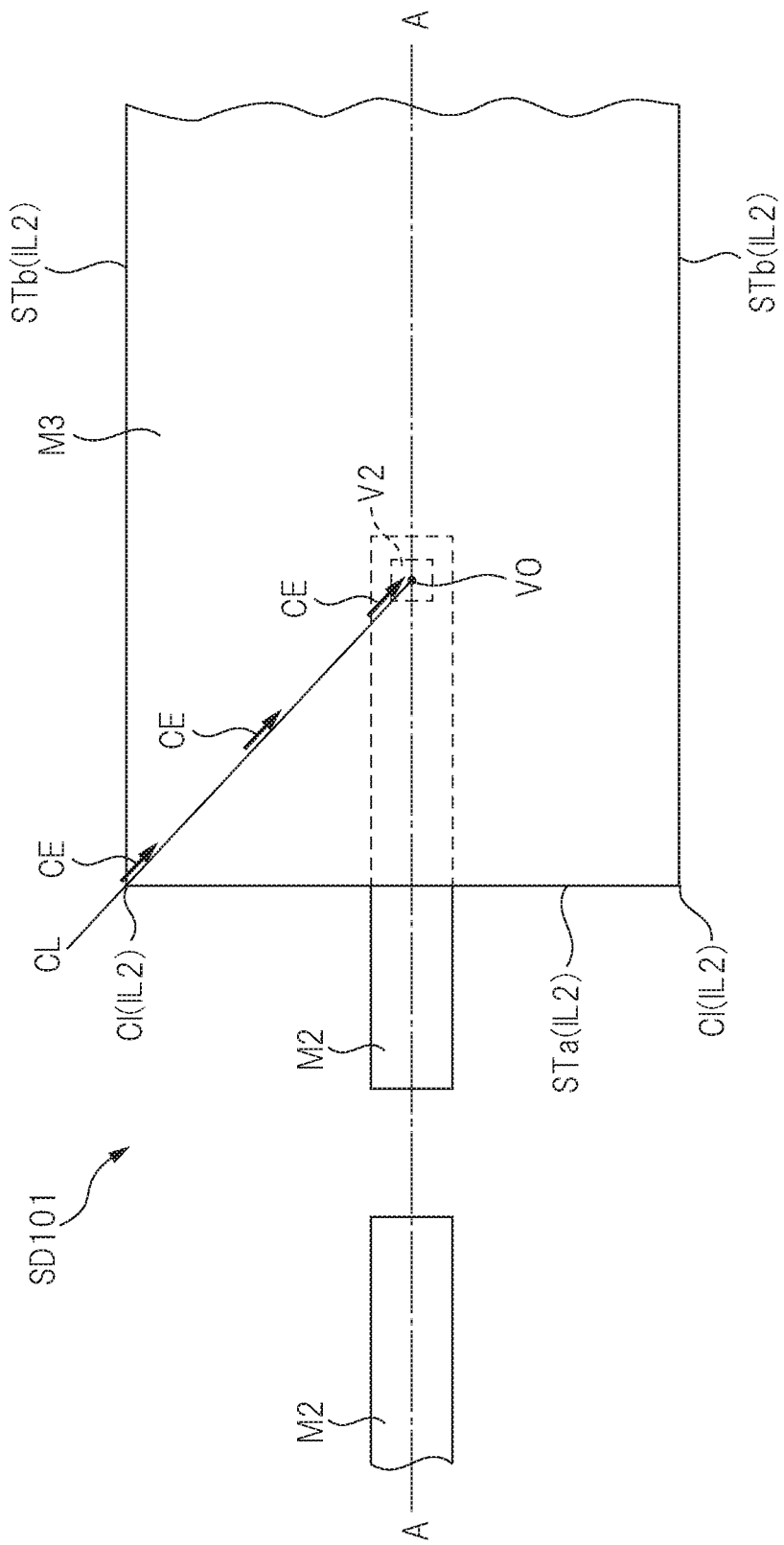
FIG. 8 is an enlarged plan view showing the semiconductor device of the study example.

Hereinafter, the configuration of the semiconductor device of the examination example discussed by the present inventor will be described. FIG. 8 is an enlarged plan view of the semiconductor device SD101 of the semiconductor device of the study examples.

As shown in FIG. 8, in the semiconductor device SD101 of the study example, the dummy interconnection DM and the dummy via DV1, DV2, DV3, DV4 are not formed, which is a difference between the semiconductor device SD101 of the study example and the SD1a of the first embodiment. Since the other configuration of the semiconductor device SD101 of the study examples is the same as the configuration of the semiconductor device SD1a of the first embodiment, repeated descriptions including the manufacturing process of the semiconductor device SD101 are omitted.

Figure 9:
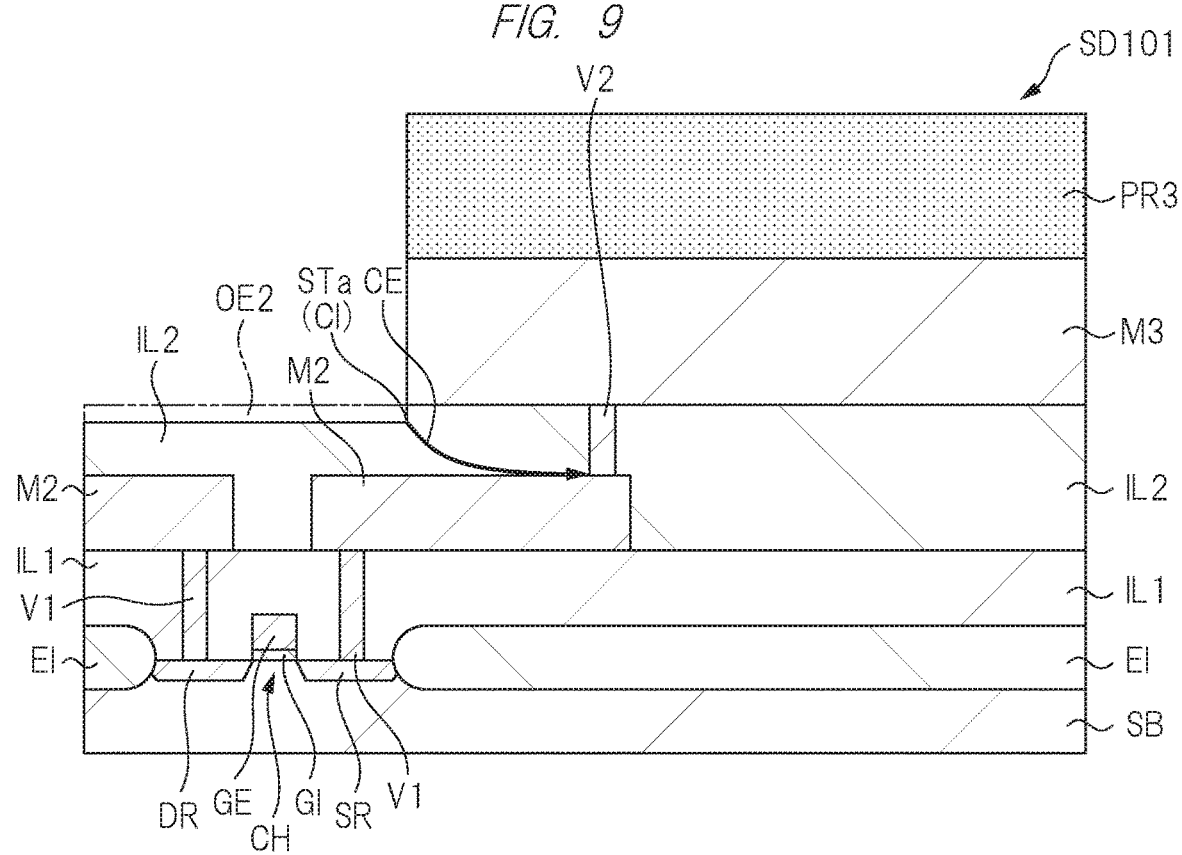
FIG. 9 is a cross-sectional view of a main part in the manufacturing process of the semiconductor device of the study example, showing a structure cut along a line corresponding to the line A-A in FIG. 8.
Figure 10:
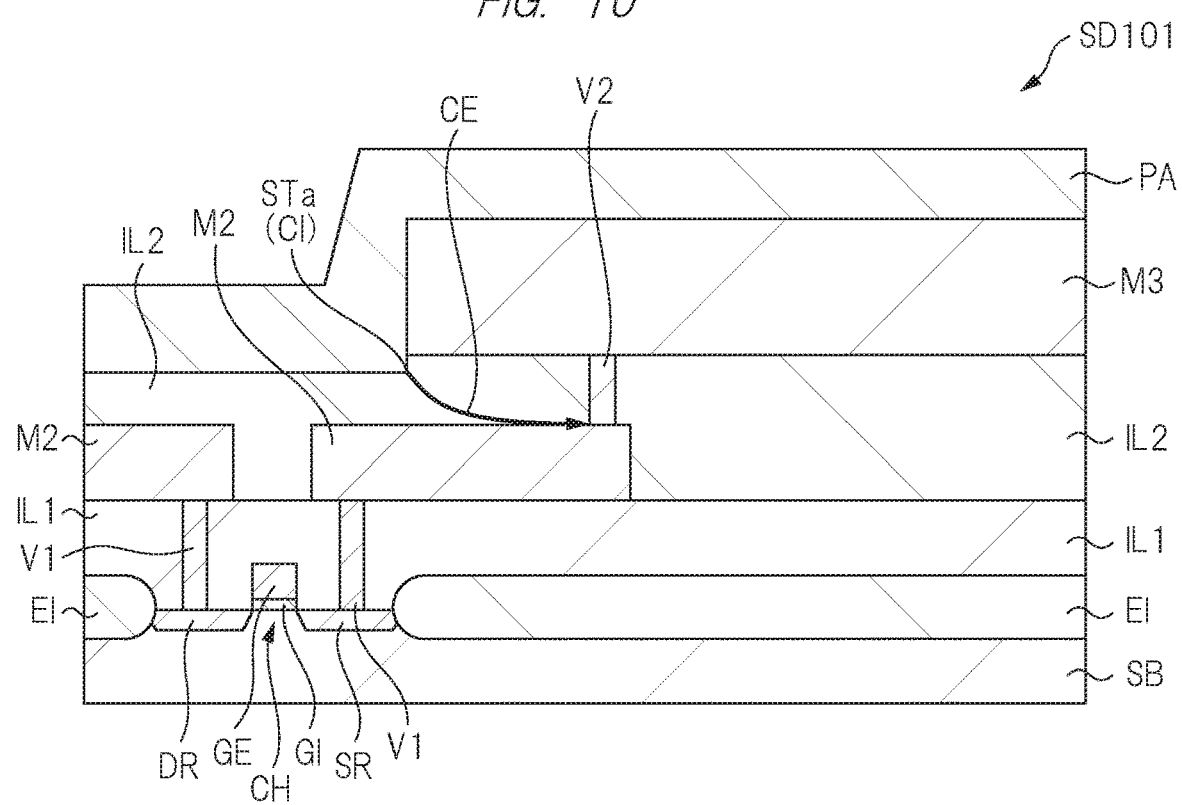
FIG. 10 is a main part cross-sectional view showing a structure taken along a line corresponding to the line A-A in FIG. 8 in a main part cross-sectional view during the manufacturing process of the semiconductor device of the study example following FIG. 9.

Here, the problem found by the present inventor will be described with respect to the examination example. FIG. 9 and FIG. 10 are cross-sectional views of the main part of the semiconductor device SD101 during the manufacturing process of the semiconductor device of the study examples, showing structures cut along the line corresponding to the line A-A in FIG. 8. FIG. 9 corresponds to a cross-sectional view of a main part in the manufacturing process after FIG. 6A and before FIG. 7A. FIG. 10 corresponds to a cross-sectional view of a main part of FIG. 2A.

According to the investigation by the present inventor, it was found that cracks (cracks, cracks) occur due to the formation of the wiring M 3. Specifically, the thermal shrinkage of the conductor film CD3 constituting the interconnection M3 and the etching of the conductor film CD3 are causes. Hereinafter, the reason will be described in detail.

First, thermal shrinkage of the conductive film CD3 will be described. The temperatures at which the conductive film CD3 shown in FIGS. 6A and 6B is formed reach about 400° C. Therefore, when the conductive film CD3 is cooled to a normal temperature of about 25° C., a large thermal shrinkage occurs. Actually, deformation of the conductor film CD3 is prevented by frictions between the conductor film CD3 and the insulating film IL2, and thermal stresses remain in the conductor film CD3 M3. Therefore, when the stresses remaining on the CD3 of the conductor film are released for some reason, cracks occur in the interlayer insulating film, the interface between the conductor film and the insulating film constituting the interconnection, and the like. In particular, if the via is broken by the crack, a conduction failure (open failure) between the wirings occurs.

Like the conductor film CD3, when the conductor film CD2 shown in FIGS. 3A and 3B is formed, thermal stresses also remain. However, as the thickness of the conductor film increases, and as the area of the conductor film increases, the stress remaining in the conductor film increases with heat shrinkage. Therefore, the cause of the crack is larger than the cause of the thermal stress remaining in the conductor film CD2 (wiring M2) due to the thermal stress remaining in the conductor film CD3 (wiring M3).

Next, the etching of the conductive film CD3 will be described. As shown in FIG. 9, when the interconnect M3 is formed by etching the conductor film CD3 (see FIG. 6A) using the photoresist pattern PR3 as a mask, if the etching time is short, a residue of the conductor film CD3 may occur. Therefore, when forming the interconnection M3, it is essential to perform over-etching on the conductor film CD3 so as not to generate a residue of the conductor film CD3. By performing over-etching on the conductor film CD3, the residue of the conductor film CD3 is not generated, but at the expense of this, an over-etched portion OE2 which is removed by over-etching of the conductor film CD3 is generated in the insulating layer IL2 existing under the conductor film CD3 which is removed by etching. The depth of the over-etched portion OE2 is, for example, 50 to 100 nm, and preferably 70 to 80 nm. The step portions STa and STb are formed in the insulating layers IL2 by the over-etched portions OE2.

Note that as the thickness of the wiring is larger, sufficient over etching is required. Therefore, although an over etched portion is formed when the wiring M2 is formed, the depth of the over etched portion of the wiring M2, which is thinner than the wiring M2, is shallower than the depth of the over etched portion OE2 when the wiring M3 is formed.

According to the study by the present inventor, it was found that stress strain is generated in the step portions STa, STb of the insulating layers IL2 by the stress remaining in the wiring M3 due to the thermal shrinkage of the conductor film CD3 constituting the wiring M3 and the etching of the conductor film CD3 described above. In particular, it has been found that the maximum stress strain occurs at the intersection of the step STa and the step STb, that is, at the corner portion CI. Therefore, it was found that the crack caused by the formation of the wiring M3 originated from the corner CI in the largest number of cases.

As shown in FIGS. 8 to 10, the stress remaining in the wiring M3 is a force that causes the wiring M3 to contract in the direction of the arrow CE due to thermal contraction. Here, when the stress remaining in the wiring M2 is also taken into consideration, the stress remaining in the wiring M2 is a force that the wiring M2 tends to contract in the direction opposite to the direction of the arrow CE due to thermal contraction. Therefore, the via V2 itself, the interface between the via V2 and the wiring M2, and the interface between the via V2 and the wiring M3 and the edge layer IL2 are most likely to be loaded. That is, it has been found that the crack originating from the corner portion CI extends toward the via V2 itself, the interface between the via V2 and the wiring M2, and the interface between the via V2 and the wiring M3 toward the interface between the edge layer IL2.

Here, the generation and elongation of cracks will be described in detail. As illustrated in FIG. 9, when the over-etch portion OE2 is formed, if the stress of the wiring M3 is released, cracks are generated from the corner portion CI as the starting point. The crack extends toward, for example, the interface between the via V2 and the wiring M2. As a result, the via V2 itself is broken or the via V2 is peeled off from the wiring M2, so that the wiring M2 and the wiring M3 are not electrically connected to each other. In FIG. 9, an extension path of such a crack is represented by an arrow CE. In the example considered, the arrow CE is along a straight line CL passing through the corner portion CI and the center VO of the via V2.

Note that a crack caused by the formation of the wiring M3 occurs due to various factors such as an operation of the semiconductor device in which a current flows through the wiring, a temperature change of the wiring or the interlayer insulating film due to the operation, and the like. Therefore, as shown in FIG. 10, such a crack may occur when the protective film PA is formed on the insulating layers IL2 and the wiring M3, or when the semiconductor device is used as a product.

From the above, it was found that cracks caused by thermal stress and over etching at the time of wiring formation cause open defects in vias. Therefore, it is desired to prevent such a via opening defect and improve the reliability of the semiconductor device.

Figure 11:
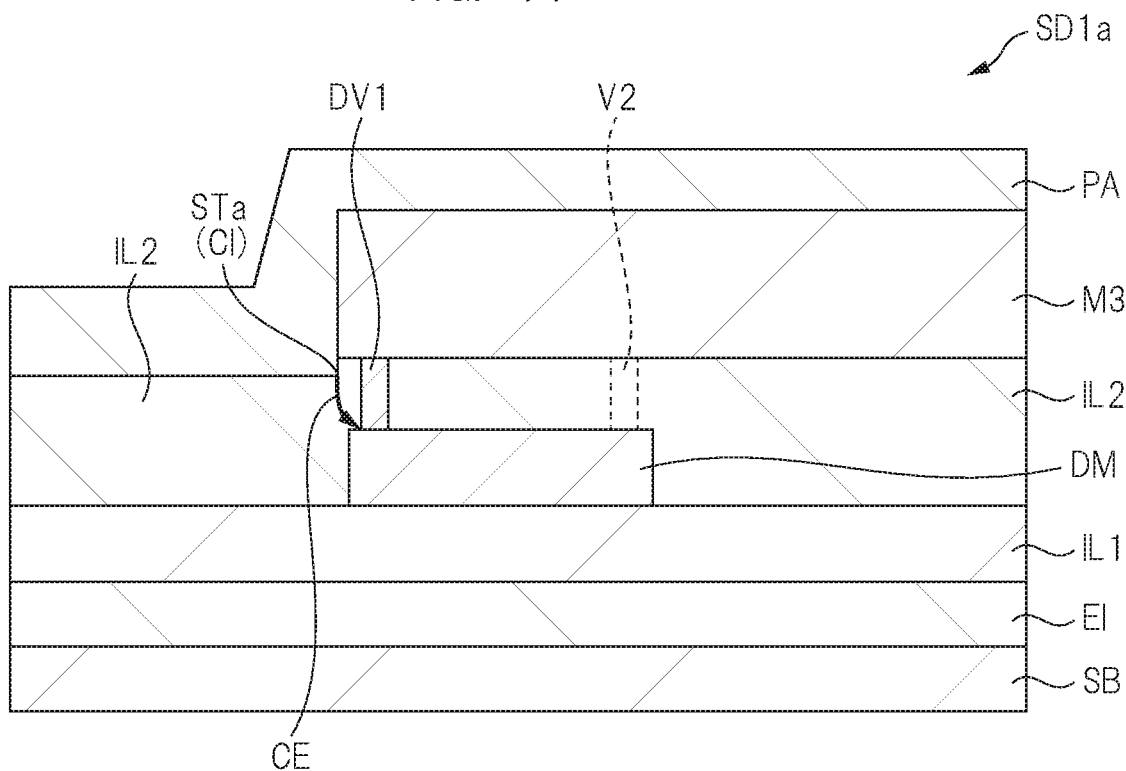
FIG. 11 is a main part cross-sectional view showing the positional relationship between the first via and the second via in the structure cut along the line B-B in FIG. 1 in the semiconductor device of the embodiment.
Figure 12:
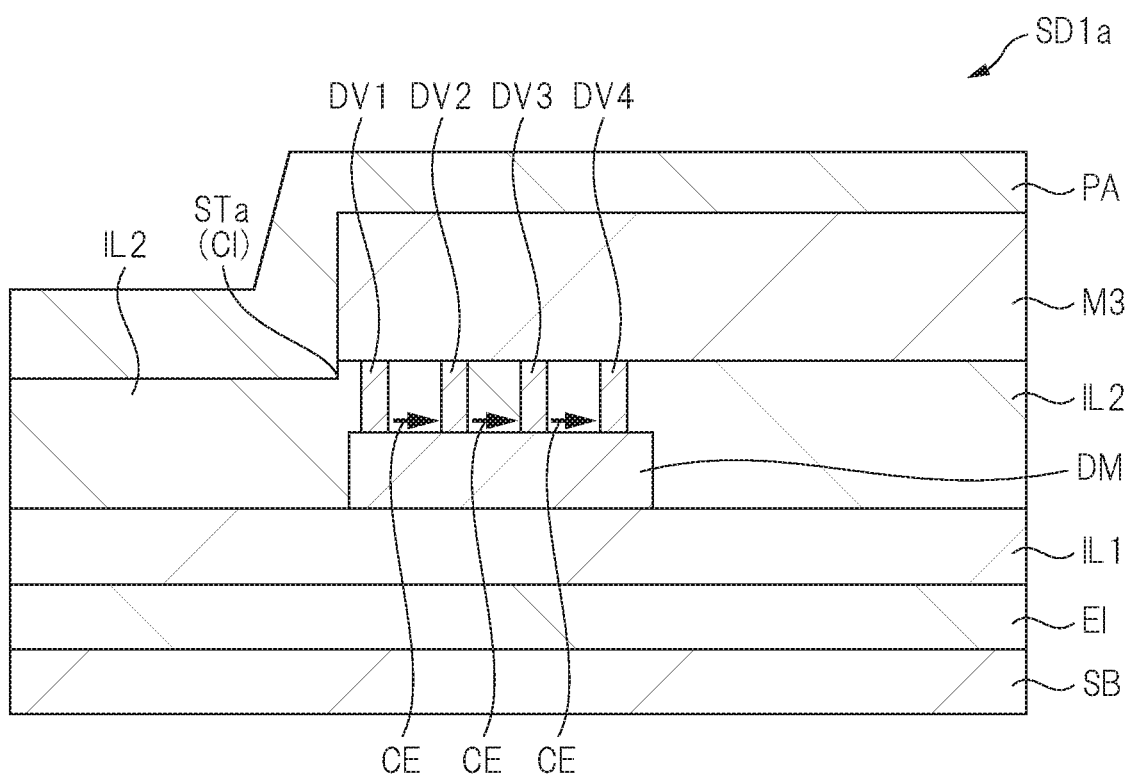
FIG. 12 is a cross-sectional view of a main part showing a structure taken along the line B-B in FIG. 1 in the semiconductor device according to the embodiment.

Hereinafter, main features of Embodiment 1 will be described. FIG. 11 is a cross-sectional view of a main part showing a positional relation between a first via and a second via in a configuration cut along the line B-B in FIG. 1 in the semiconductor device. SD1a of the first embodiment. FIG. 12 is a cross-sectional view of a main part of the semiconductor device SD1a of the first embodiment, the semiconductor device being cut along the line B-B in FIG. 1.

As illustrated in FIGS. 1, 11, and 12, one of the main features of the semiconductor device SD1a of the first embodiment is that it has a plurality of dummy vias (second vias) DV1, DV2, DV3, DV4 in contact with the dummy wiring (first conductor pattern) DM and the wiring M3 formed in the same wiring layer as the wiring M2, in addition to the vias (first vias) V2 contacting the wiring M2 and the wiring M3.

The dummy wiring lines DM and the dummy vias DV1, DV2, DV3, DV4 are symmetrically arranged with a straight line (A-A line) passing through the widthwise center of the wiring line M3 interposed therebetween. That is, in a plan view, the dummy wirings (second conductor patterns) DM and the dummy vias (third vias) DV1, DV2, DV3, DV4 are arranged symmetrically to the dummy wiring (first conductor patterns) DM and the dummy vias (second vias) DV1, DV2, DV3, DV4, respectively, with a straight line (A-A line) passing through the widthwise center of the wiring M3 interposed therebetween.

The distance Dai (distance Da1, Da2, Da3) between adjacent dummy vias in the dummy via DV1, DV2, DV3, DV4 is shorter than any of the distances Dbi (distance Db1, Db2, Db3, Db4) between any of the dummy vias DV1, DV2, DV3, DV4 and the via V2. In plan view, the distance between the dummy via DV1 and the corner portion CI is shorter than the distance between the via V2 and the corner portion CI. The distance between the dummy via DV4 and the corner portion CI is longer than the distance between the via V2 and the corner portion CI.

In Embodiment Mode 1, the reliability of the semiconductor device can be improved by employing such a structure. Hereinafter, the reason will be described in detail.

As described above, the crack caused by the formation of the wiring M3 thicker than the wiring M2 is most often generated from the corner portion CI as the starting point. Therefore, in the first embodiment, a dummy via DV1 is provided in addition to the via V2, so that the distance between the corner portion CI and the dummy via DV1 is shorter than the distance between the corner portion CI and the via V2 in plan view. Thus, as shown in FIG. 11, the crack starting from the corner portion CI extends toward the dummy via DV1 closer to the corner portion CI than the via V2, as shown by the arrow CE. That is, instead of breaking the via V2, the dummy via DV1 is broken, and the via V2 does not have to be broken.

However, a crack extending from the corner portion CI to the dummy via DV1 may extend toward another via. Therefore, by simply arranging the dummy via DV1 at a position closer to the corner portion CI than the via V2, the possibility of the crack extending to the via V2 cannot be reduced. Therefore, in the first embodiment, the dummy via DV2 is further provided, and the distance between the dummy via DV1 and the dummy via DV2 adjacent to the dummy via DV1 is made shorter than the distance between the dummy via DV1 and the via V2. Thus, as shown in FIG. 12, the crack extending from the corner portion CI to the dummy via DV1 extends toward the dummy via DV2 closer to the dummy via DV1 than the via V2. That is, instead of breaking the via V2, the dummy via DV2 is broken, and the via V2 does not have to be broken.

Subsequently, the distance between the dummy via DV2 and the dummy via DV3 adjacent to the dummy via DV2 is shorter than the distance between the dummy via DV2 and the via V2. Thus, shown in FIG. 12, the crack extending from the dummy via DV1 to the dummy via DV2 extends toward the dummy via DV3 closer to the dummy via DV2 than the via V2. That is, instead of breaking the via V2, the dummy via DV3 is broken, and the via V2 does not have to be broken.

Subsequently, the distance between the dummy via DV3 and the dummy via DV4 adjacent to the dummy via DV3 is shorter than the distance between the dummy via DV3 and the via V2. Thus, as shown in FIG. 12, the crack extending from the dummy via DV2 to the dummy via DV3 extends toward the dummy via DV4 closer to the dummy via DV3 than the via V2. That is, instead of breaking the via V2, the dummy via DV4 is broken, and the via V2 does not have to be broken.

The distance between the dummy via DV4 and the corner portion CI is longer than the distance between the via V2 and the corner portion CI. Therefore, a crack extending from the corner portion CI to the dummy via DV4 via the dummy via DV1, DV2, DV3 is unlikely to extend to the via V2 whose extension directions differ greatly. As a result, the via V2 does not need to be broken.

As described above, in the first embodiment, in plan view, the distance between the dummy via DV1 and the corner portion CI is made shorter than the distance between the via V2 and the corner portion CI, and the distance Dai between adjacent dummy vias of the dummy via DV1, DV2, DV3, DV4 is made shorter than any of the distances Dbi between any of the dummy vias DV1, DV2, DV3, DV4 and the via V2. The distance between the dummy via DV4 and the corner portion CI is made longer than the distance between the via V2 and the corner portion CI. By doing so, when cracks caused by thermal stresses and over etching at the time of forming wirings are generated in the corner portions CI, the cracks are induced to the dummy via DV1, DV2, DV3, DV4 in which the cracks are more likely to extend than the via V2, thereby preventing the via V2 from being defective in opening.

In addition, the inventors of the present invention have found that cracks tend to elongate so as to peel off between the conductor film and the insulating layer. In the first embodiment, each of the dummy vias DV1, DV2, DV3, DV4 contacts the dummy metal DMs. Therefore, the crack extending from the corner portion CI to the dummy via DV1 tends to extend to the dummy via DV2 so as to peel off between the insulating layer IL2 and the dummy metal layer DM. Similarly, a crack extending in the dummy via DV2 tends to extend to the dummy via DV3 so as to peel off between the insulating layers IL2 and the dummy metal DMs. Similarly, a crack extending in the dummy via DV3 tends to extend to the dummy via DV4 so as to peel off between the insulating layers IL2 and the dummy metal DMs. As described above, in the first embodiment, the crack extending from the corner portion CI to the dummy via DV1 can be reliably guided to the dummy via DV2, DV3, DV4. As a result, it is possible to prevent the crack generated from the corner portion CI from extending to the via V2, and to prevent the situation in which the wiring M2 and the wiring M3 are not electrically connected to each other.

As described above, according to the first embodiment, by inducing a crack caused by over etching at the time of wiring formation in the dummy via, it is possible to prevent the via from becoming an open defect and to improve the reliability of the semiconductor device.

Further, as shown in FIG. 1, in the first embodiment, there are two intersections of the stepped portions STa and the stepped portions STb of the insulating layers IL2, i.e., the corner portions CI, with a straight line (A-A line) passing through the center of the widthwise direction of the wire M3 interposed therebetween in plan view, but both of the corner portions CI are equal in shape and arrangement. Therefore, stress strain occurs equally in both corner portions CI. Therefore, the probability that a crack caused by the formation of the wiring M3 is generated from the corner portion CI as a starting point is equal in the two corner portions CI. Therefore, in the first embodiment, by symmetrically arranging the dummy wiring DM and the dummy via DV1, DV2, DV3, DV4 with a straight line (A-A line) passing through the width-direction center of the wiring M3 interposed therebetween, it is possible to induce a crack in the dummy via DV1 closest to each of the two corner portions CIs as a starting point. The crack extended to the dummy via DV1 can be guided to the dummy via DV2, DV3, DV4 close to the dummy via DV1.

Another one of the main features of the semiconductor device SD1a of the first embodiment is that the via V2 is not on the straight line CL passing through the corner portion CI and the center DVO1 of the dummy via DV1.

As described above, as shown in FIG. 1, the crack starting from the corner portion CI extends toward the dummy via DV1 closer to the corner portion CI than the via V2, as indicated by the arrow CE. Here, a crack extending from the corner portion CI to the dummy via DV1 may extend along a straight line CL passing through the corner portion CI and the center DVO1 of the dummy via DV1. Therefore, if via V2 is at a point VO on a straight CL, it may not extend toward the dummy via DV2 closest to the dummy via DV1 and may extend toward via V2 at a point VO.

Therefore, in the first embodiment, by not forming the via V2 on the straight line CL, the possibility that a crack extending from the corner portion CI to the dummy via DV1 extends toward the via V2 can be reduced.

In the first embodiment, the dummy vias DV1, DV2, DV3, DV4 are arranged in a straight line (line B-B) along the length of the dummy wirings DM. Therefore, if the crack extended to the dummy via DV1 can be induced to the dummy via DV2 close to the dummy via DV1, the crack extended to the dummy via DV2 can be easily extended to the dummy via DV3, DV4 on the same line as the dummy via DV2. As a result, the possibility that the crack extends toward the via V2 can be further reduced.

In the first embodiment, the case has been described as an example in which both of (1) the distance Dai between adjacent dummy vias in the dummy via DV1, DV2, DV3, DV4 is shorter than any of the distances Dbi between any of the dummy vias DV1, DV2, DV3, DV4 and the via V2, and (2) the structure in which the via V2 is not on the straight line CL passing through the corner portion CI and the center DVO1 of the dummy via DV1 are provided. However, if the above-mentioned structure (1) is provided, the crack extending from the corner portion CI to the dummy via DV1 can be guided to the dummy via DV2, DV3, DV4, and thus the above-mentioned structure (2) is not indispensable.

However, by not forming the via V2 on the straight line CL, it is possible to reduce the possibility that a crack extending from the corner portion CI to the dummy via DV1 extends toward the via V2, and therefore it is preferable to have both the configuration (1) and the configuration (2).

In the first embodiment, the case where the dummy vias DV1, DV2, DV3, DV4 and the case where four dummy vias are provided is described as an example, but the present invention is not limited to this case, and the number of dummy vias may be any number as long as the condition that the distance Dai between adjacent dummy vias is shorter than any of the distances Dbi between any of the dummy vias and the vias is satisfied. A larger number of dummy vias is preferred to reduce the likelihood of cracks extending toward the vias. On the other hand, in order to reduce the design cost and the manufacturing cost, it is preferable that the number of dummy vias is small.

As described above, the dummy wiring DM may be used as an actual wiring, or the dummy via DV1, DV2, DV3, DV4 may be used as an actual via. Therefore, the dummy wiring DM may be in direct contact with the wiring M2, or may be formed integrally with the wiring M2. However, as described above, the crack tends to stretch so as to peel off between the conductor film and the insulating layer. Therefore, in order to reliably prevent the crack from extending to the via V2, it is preferable that the dummy wiring DM is formed separately from the wiring M2, and the dummy wiring DM and the wiring M2 are not in contact with each other.

Figure 13:
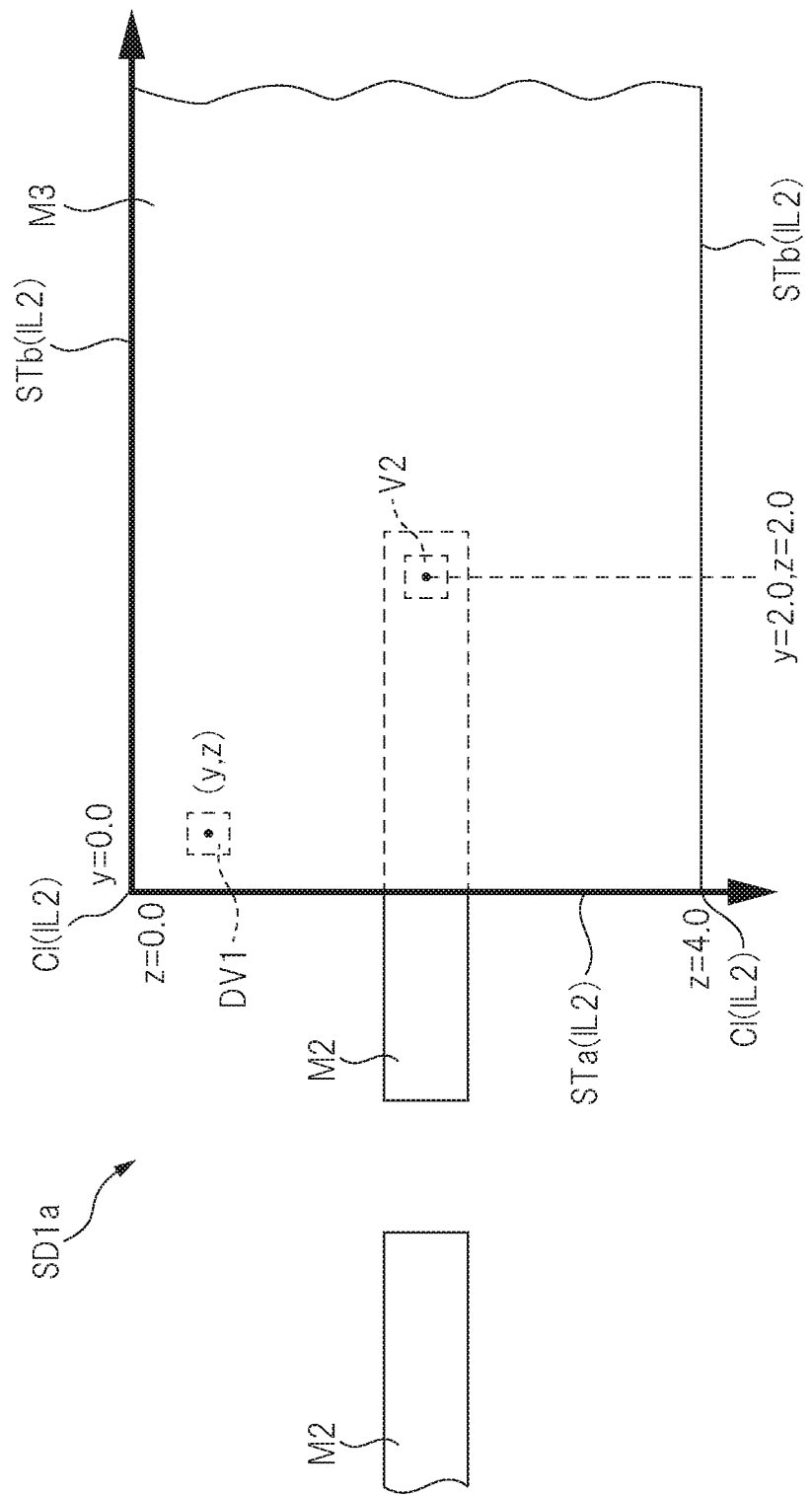
FIG. 13 is an enlarged plan view showing a positional relationship between the first via and the second via in a plan view in the semiconductor device according to the embodiment.
Figure 14:
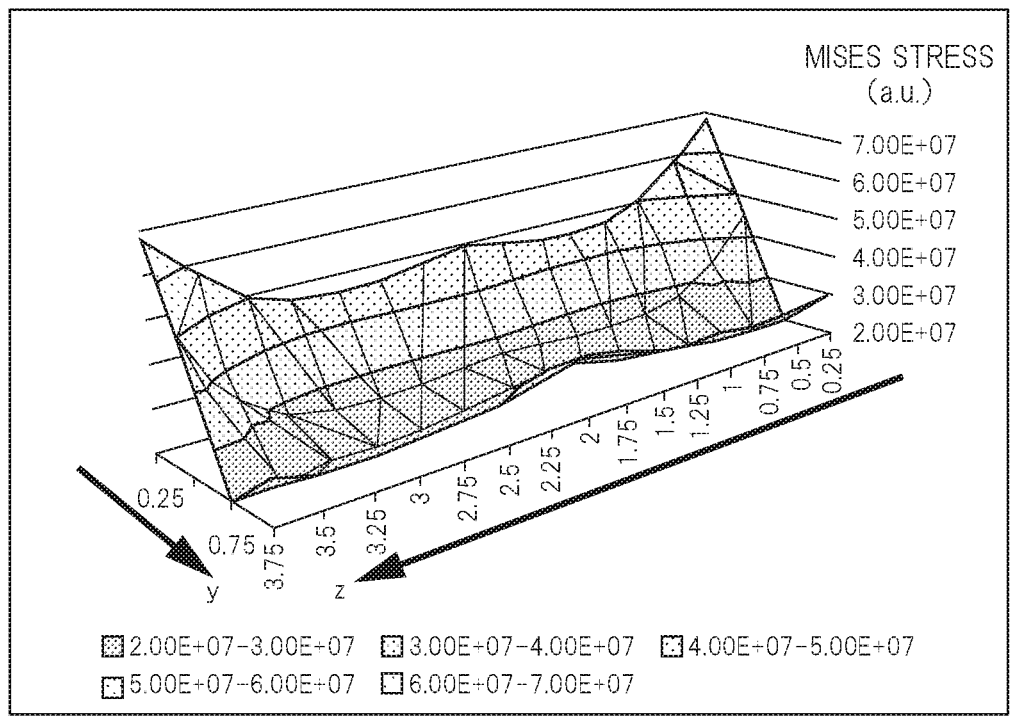
FIG. 14 is a graph showing the relationship between the position of the second via in plan view and the stress applied to the bottom of the second via in the semiconductor device according to the embodiment.
Figure 15:
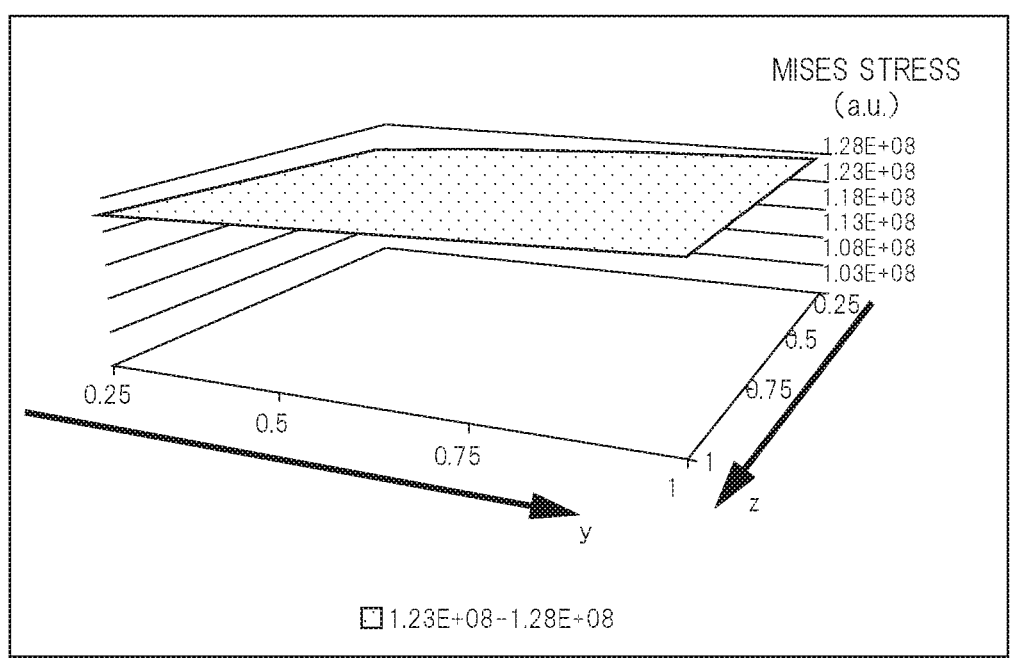
FIG. 15 is a graph showing the relationship between the position of the second via and the stress applied to the corner in plan view in the semiconductor device according to the embodiment.

Here, optimization of the arrangement of the dummy via DV1 will be discussed. FIG. 13 is an enlarged plan view showing a positional relation between the via V2 and the dummy via DV1 in a plan view in the semiconductor device SD1a according to the first embodiment. FIG. 14 is a graph showing the relation between the position of the dummy via DV1 and the stresses applied to the bottom of the dummy via DV1 in a plan view in the semiconductor device SD1a of Embodiment 1. FIG. 15 is a graph showing the relation between the position of the dummy via DV1 in plan view and the stresses applied to the corner portions CIs in the semiconductor device SD1a of the first embodiment.

First, as shown in FIG. 13, in plan view, the axis along the length direction of the wiring M3 is taken as the y-axis, and the axis along the width direction of the wiring M3 is taken as the z-axis. The coordinates of one of the corner portions CI are (y, z)=(0.0, 0.0). Here, the other coordinate of the corner portion CI is (y, z)=(0,0, 4.0), and the coordinate of the via V2 is (y, z)=(2.0, 2.0). Assuming the above, the stress applied to the bottom portion of the dummy via DV1 and the stress applied to the corner portion CIs when the coordinate (y, z) of the dummy via DV1 was changed were examined by simulations.

FIG. 14 shows the Mises stresses on the bottom of the dummy via DV1 when the coordinate (y, z) of the dummy via DV1 is changed. Mises stress is one of the equivalent stresses used to indicate the stress state occurring within an object in a single value. As shown in FIG. 14, when the coordinate of the dummy via DV1 is changed, the stresses at the bottom of the dummy via DV1 are maximized when the position of the dummy via DV1 is (y, z)=(0.25, 0.25) and (y, z)=(0.25, 3.75). That is, when the dummy via DV1 is closest to the corner portion CI, the largest stresses are generated in the bottom portion of the dummy via DV1. The further away the dummy via DV1 is from the step STa (corner portion CI), the smaller the Mise stress applied to the bottom of the dummy via DV1.

FIG. 15 shows the Mises stresses applied to the corner portions CIs when the coordinate (y, z) of the dummy via DV1 is changed. As shown in FIG. 15, when the coordinate of the dummy via DV1 is changed, the stresses applied to the corner portions CIs are substantially constant regardless of the position of the dummy via DV1.

As described above, in plan view, by making the distance between the dummy via DV1 and the corner portion CI shorter than the distance between the via V2 and the corner portion CI, the stress generated in the bottom portion of the dummy via DV1 can be made larger than the stress generated in the bottom portion of the via V2. Thus, as shown in FIG. 1, the crack starting from the corner portion CI extends toward the dummy via DV1 closer to the corner portion CI than the via V2, as indicated by the arrow CE. That is, instead of breaking the via V2, the dummy via DV1 is broken, and the via V2 does not have to be broken. As can be seen from the results shown in FIGS. 14 and 15, in order to reliably induce cracks from the corner portion CI to the dummy via DV1, the dummy via DV1 is preferably arranged as close as possible to the corner portion CI in plan view.

Figure 16:
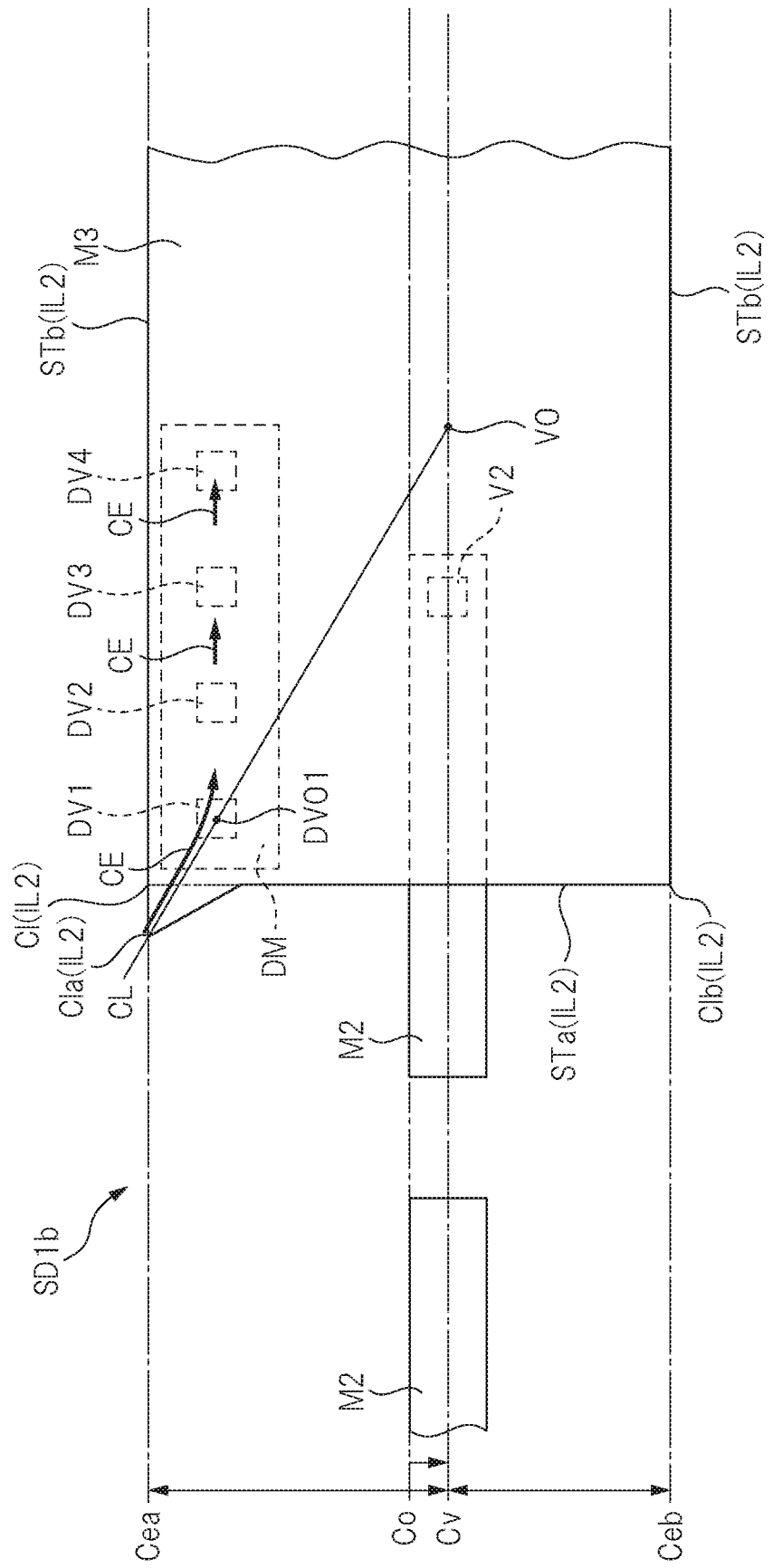
FIG. 16 is an enlarged plan view showing the semiconductor device of the first modification.

The semiconductor device of the first modification example (hereinafter, modification example 1) of the first embodiment will be described. FIG. 16 is an enlarged plan view showing the SD1b of the semiconductor device according to the first modification.

As shown in FIG. 16, in the first modification, the corner portion CIa is formed at an acute angle in one of the two corner portions of the wire M3 in plan view, and as a result, the corner portion CIa is also formed at an acute angle in the insulating layer IL2. The other corner portion CIb of the wire M3 is not formed at an acute angle, and as a result, the corner portion CIb is not formed at an acute angle even in the insulating layer IL2.

Further, in plan view, the wiring M2 and the via V2 are formed along a straight line Cv parallel to the straight lines Cea and Ceb passing through the end portion in the width direction of the wiring M3. The distance between the straight line Cea and the straight line Cv on the side of the corner portion CIa formed at an acute angle is longer than the distance between the straight line Ceb and the straight line Cv on the side of the corner portion CIb not formed at an acute angle. That is, the distance between the straight line Cea on the side of the corner portion CIa formed at an acute angle and the straight line Cv is longer than the distance between the straight line Cea on the side of the corner portion CIa formed at an acute angle and the straight line Co passing through the center in the width direction of the wiring M3.

The above points are different points between the semiconductor device SD1b of the first modification and the semiconductor device SD1a of the first embodiment. Since the other configuration of the semiconductor device SD1b of the first modification is the same as the configuration of the semiconductor device SD1a of the first embodiment, the repeated explanation is omitted.

As described above, in the first embodiment shown in FIG. 1, the two corner portions CI have the same shape and arrangement in plan view. Therefore, stress strain is equally generated in both corner portions CI, and as a result, the probability that cracks caused by the formation of the wiring M3 are generated from the corner portion CI as a starting point is equal in the two corner portions CI. Therefore, the dummy wirings DM and the dummy vias DV1, DV2, DV3, DV4 are symmetrically arranged with a straight line (A-A line) passing through the widthwise center of the wiring M3 interposed therebetween.

On the other hand, in Modification 1 shown in FIG. 16, since one corner portion CIa is formed at an acute angle in plan view, the magnitude of stress strain generated in the corner portion CIa is larger than that in the other corner portion CIb. Therefore, the probability that the crack caused by the formation of the wiring M3 is generated from the corner portion CIa as a starting point is higher than the probability that the crack is generated from the corner portion CIb as a starting point.

Therefore, in the first modification, the dummy interconnections DM and the dummy vias DV1, DV2, DV3, DV4 are arranged in the vicinity of the corner portions CIa. By doing so, it is possible to reliably induce a crack generated from the corner portion CIa as a starting point to the dummy via DV1 closest to the corner portion CIa. Then, similarly to the first embodiment, cracks are induced from the dummy via DV1 to the dummy via DV2, from the dummy via DV2 to the dummy via DV3, and from the dummy via DV3 to the dummy via DV4, thereby preventing cracks from extending to the via V2.

Further, in the first modification, by forming the corner portion CIa at an acute angle, cracks originating from the cornier portion CIb are relatively unlikely to occur, so that the dummy interconnection DM and the dummy via DV1, DV2, DV3, DV4 do not need to be arranged in the vicinity of the corner portion CIb.

In Modification 1, the wiring M2 and the via V2 are formed on a straight line Cv whose distance from the straight line Cea on the side of the corner portion CIa formed at an acute angle is longer than the straight line Co passing through the center in the width direction of the wiring M3. As described above, the probability that the crack caused by the formation of the wiring M3 is generated from the corner portion CIa formed at an acute angle as the starting point is higher than the probability that the crack is generated from the corner portion CIb as the starting point. Therefore, by keeping the via V2 away from the corner portion CIa in advance, it is possible to prevent a crack generated from the corner portion CIa as a starting point from extending to the via V2.

As described above, in the first modification, similarly to the first embodiment, it is possible to prevent a situation in which a crack caused by the formation of the wiring M3 extends to the via V2 to break the via V2 and cause an open defect. The first modification is advantageous over the first embodiment in that the dummy wirings DM and the dummy vias DV1, DV2, DV3, DV4 do not need to be arranged in the vicinity of the corner portions CIb, and manufacturing costs can be reduced. On the other hand, the first embodiment has an advantage over the first modification in that, even if a crack is generated from any of the two corner portions CIs as a starting point, a crack can be induced in the dummy via DV1 closest to each of the corner portions CIs, thereby preventing breakage of the via V2.

Figure 17:
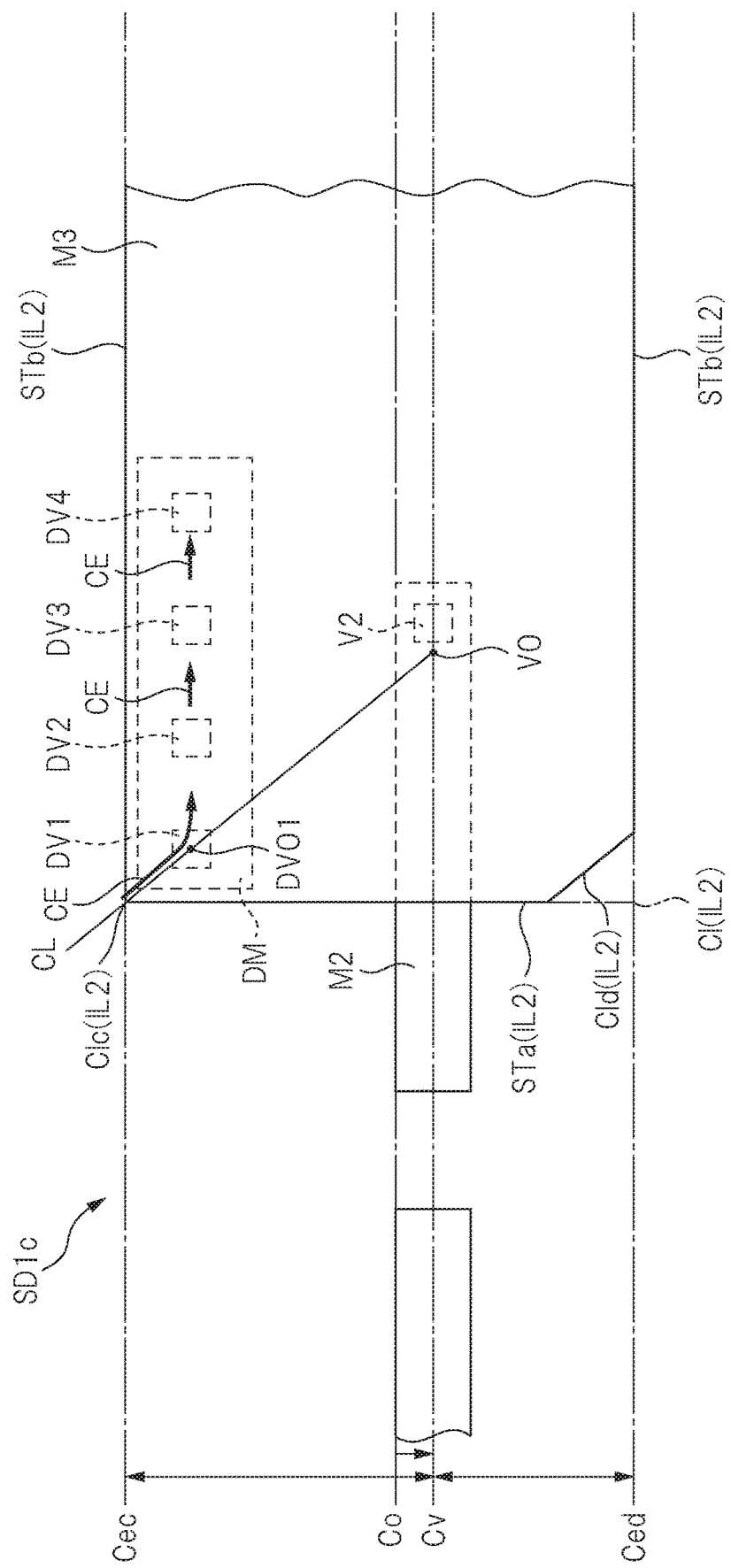
FIG. 17 is an enlarged plan view showing the semiconductor device of the second modification.

The semiconductor device of the second modification example (hereinafter, modification example 2) of the first embodiment will be described. FIG. 17 is an enlarged plan view showing the SD1c of the semiconductor device according to the second modification.

As shown in FIG. 17, in the second modification, the corner portion CId is formed at an obtuse angle in one of the two corner portions of the wire M3 in plan view, that is, the corner portion CId is chamfered, and as a result, the corner portion is formed at an obtuse angle in the insulating layer IL2 as well. In particular, in Modification 2, the corner portion CId has a structure in which the corner of the rectangle is recessed inward in plan view. The other corner portion CIc of the wire M 3 is not formed at an obtuse angle, and as a result, the corner portion CIc is not formed at an obtuse angle even in the insulating layer IL2.

Further, in plan view, the wiring M2 and the via V2 are formed along a straight line Cv parallel to the straight lines Cec and Ced passing through the end portion in the width direction of the wiring M3. The distance between the straight line Cec and the straight line Cv on the side of the corner portion CIc not formed at an obtuse angle is longer than the distance between the straight line Ced and the straight line Cv on the side of the corner portion CId formed at an obtuse angle. That is, the distance between the straight line Ced on the side of the corner portion CId formed at an obtuse angle and the straight line Cv is shorter than the distance between the straight line Ced on the side of the corner portion CId formed at an obtuse angle and the straight line Co passing through the center in the width direction of the wiring M3.

The above point is a difference between the semiconductor device SD1c of the second modification and the semiconductor device SD1a of the first embodiment. Since the other configuration of the semiconductor device SD1c of the second modification is the same as the configuration of the semiconductor device SD1a of the first embodiment, the repetitive explanation is omitted.

As described above, in the first embodiment shown in FIG. 1, the two corner portions CI have the same shape and arrangement in plan view. Therefore, stress strain is equally generated in both corner portions CI, and as a result, the probability that cracks caused by the formation of the wiring M3 are generated from the corner portion CI as a starting point is equal in the two corner portions CI. Therefore, the dummy wirings DM and the dummy vias DV1, DV2, DV3, DV4 are symmetrically arranged with a straight line (A-A line) passing through the widthwise center of the wiring M3 interposed therebetween.

On the other hand, in Modification 2 shown in FIG. 17, since one corner portion CId is formed at an obtuse angle in plan view, the magnitude of stress strain generated in the corner portion CId is smaller than that in the other corner portion CIc. Therefore, the probability that the crack caused by the formation of the wiring M3 is generated from the corner portion CId as the starting point is lower than the probability that the crack is generated from the corner portion CIc as the starting point.

Therefore, in the second modification, the dummy interconnections DM and the dummy vias DV1, DV2, DV3, DV4 are arranged in the vicinity of the corner portions CIc. By doing so, it is possible to reliably induce a crack generated from the corner portion CIc as a starting point to the dummy via DV1 closest to the corner portion CIc. Then, similarly to the first embodiment, cracks are induced from the dummy via DV1 to the dummy via DV2, from the dummy via DV2 to the dummy via DV3, and from the dummy via DV3 to the dummy via DV4, thereby preventing cracks from extending to the via V2.

Further, in Modification 2, by forming the corner portion CId at an obtuse angle, cracks originating from the corner portion CId are relatively unlikely to occur, so that the dummy interconnection DM and the dummy via DV1, DV2, DV3, DV4 do not need to be arranged in the vicinity of the corner portion CId.

In Modification 2, the wiring M2 and the via V2 are formed on a straight line Cv whose distance from the straight line Ced on the corner portion CId side formed at an obtuse angle is shorter than the straight line Co passing through the center of the wiring M3 in the width direction. As described above, the probability that the crack caused by the formation of the wiring M3 is generated from the corner portion CId formed at an obtuse angle as the starting point is lower than the probability that the crack is generated from the corner portion CIc as the starting point. Therefore, by bringing the via V2 closer to the corner portion CId in advance, it is possible to relatively move the via V2 away from the corner portion CIc and prevent a crack generated from the corner portion CIc as a starting point from extending to the via V2.

Thus, in the second modification, as in the first embodiment, it is possible to prevent the crack caused by the formation of the wiring M3 from extending to the via V2, causing the via V2 to break and become an open failure. The second modification is advantageous over the first embodiment in that the dummy wirings DM and the dummy vias DV1, DV2, DV3, DV4 do not need to be arranged in the vicinity of the corner portions CId, and manufacturing costs can be reduced. On the other hand, the first embodiment has an advantage over the second modification in that, even if a crack is generated from any of the two corner portions CIs as a starting point, a crack can be induced in the dummy via DV1 closest to each of the corner portions CIs, thereby preventing breakage of the via V2.

Second Embodiment

Figure 18:
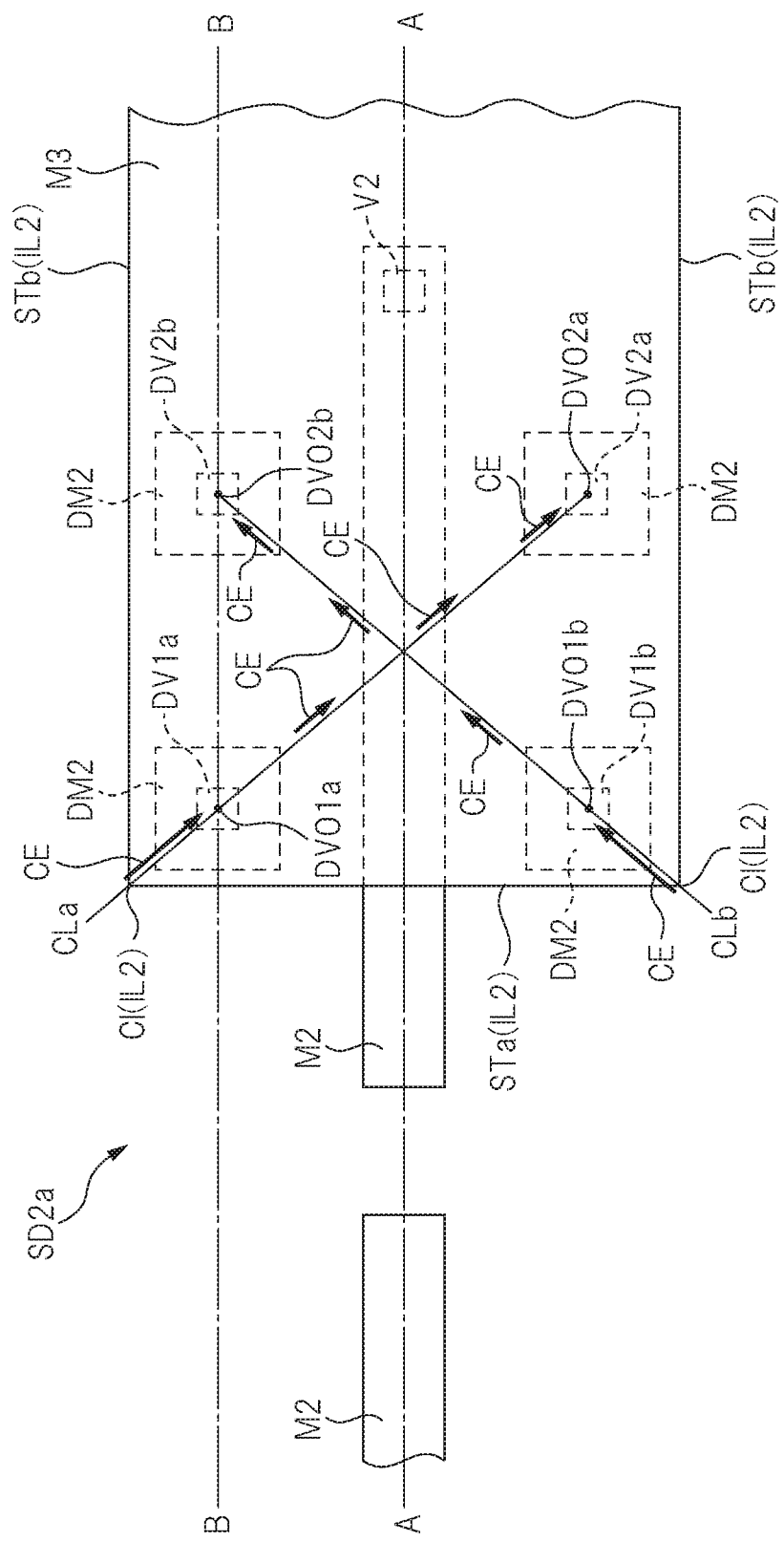
FIG. 18 is an enlarged plan view showing the semiconductor device of the second embodiment.
Figure 19:
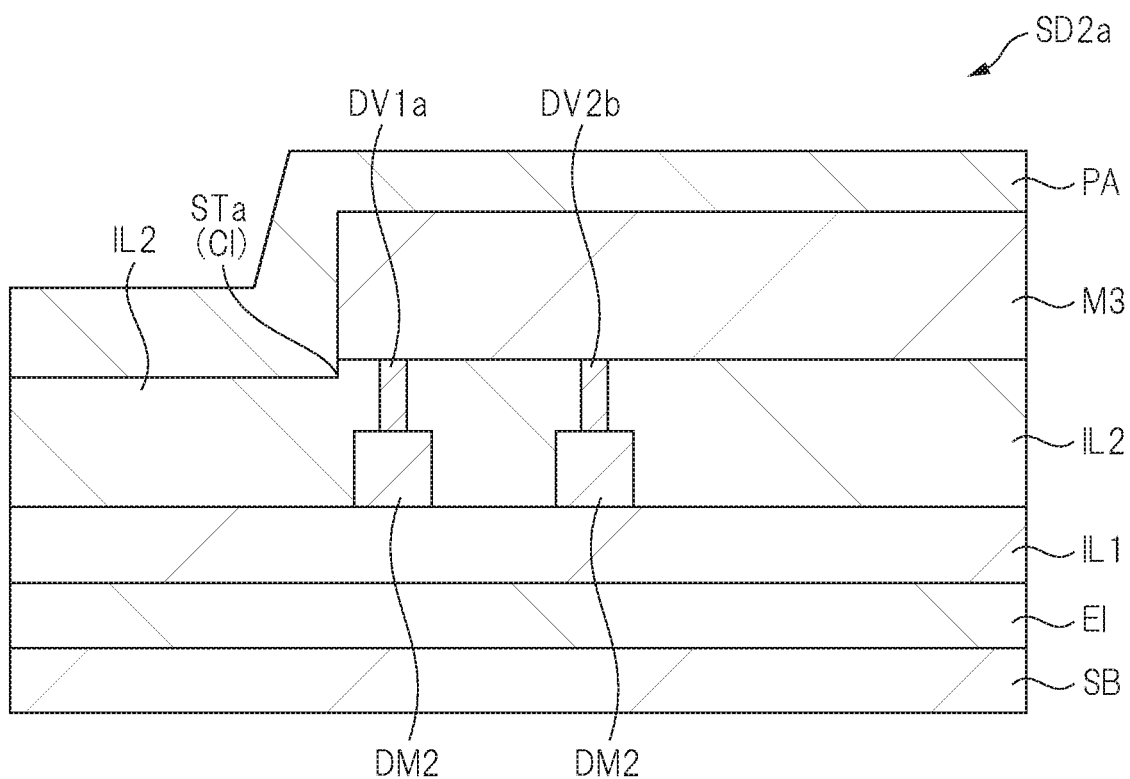
FIG. 19 is a cross-sectional view of a main part showing a structure taken along line B-B of FIG. 18 in the semiconductor device of the second embodiment.

A semiconductor device according to Embodiment 2 will be described. FIG. 18 is an enlarged plan view showing the semiconductor device SD2a of the second embodiment. FIG. 19 is a cross-sectional view of a main part of the structure device SD2a according to the second embodiment, the semiconductor device being cut along the line B-B in FIG. 18.

FIG. 18 illustrates an enlarged plan view in which other members are omitted to represent the planar arrangement of the wiring M2, M3, dummy wiring DM2, via V2 and dummy via DV1a, DV1b, DV2a, DV2b in the semiconductor device SD2a of the second embodiment.

As shown in FIG. 18, in the semiconductor device SD2a of the second embodiment, in plan view, dummy wirings (first conductor patterns) DM2 are formed at both ends in the widthwise direction of the wiring M3 along the length direction of the wiring M3. The dummy vias DV1a, DV1b, DV2a, DV2b are arranged so as to respectively touch the bottom surface of the wiring M3 and the top surface of the dummy wiring DM2. The dummy via DV1a, DV1b, DV2a, DV2b is made of, for example, a tungsten (W) film.

The dummy via DV1a and the dummy via DV1b are symmetrically arranged with a straight line (A-A line) passing through the widthwise center of the wire M3 interposed therebetween. The dummy wiring DM2 in contact with the dummy via DV1a and the dummy wiring DM2 in contact with the dummy via DV1b are symmetrically arranged with a straight line (A-A line) passing through the widthwise center of the wiring M3 interposed therebetween. The dummy via DV2a and the dummy via DV2b are symmetrically arranged with a straight line (A-A line) passing through the widthwise center of the wire M3 interposed therebetween. The dummy wiring DM2 in contact with the dummy via DV2a and the dummy wiring DM2 in contact with the dummy via DV2b are symmetrically arranged with a straight line (A-A line) passing through the widthwise center of the wiring M3 interposed therebetween.

In plan view, the dummy interconnection DM2 is formed in a square shape. The length of one side of the dummy wiring DM2 is smaller than the width of the wiring M3 and equal to or larger than the width of the wiring M2.

The dummy via DV1a is closest to the corner portion CI in the dummy via DV1a, DV2a. The distance between the via DV2 and the corner portion CI is longer than the distance between the dummy via DV2a and the corner portion CI. The dummy via DV1b is closest to the corner portion CI in the dummy via DV1b, DV2b. The distance between the via DV2 and the corner portion CI is longer than the distance between the dummy via DV2b and the corner portion CI.

In plan view, the center DVO2a of the dummy via (fourth via) DV2a is on a straight line CLa passing through the corner portion (first corner portion) CI and the center DVO1a of the dummy via (second via) DV1a. The center DVO2b of the dummy via (fifth via) DV2b is on a straight line CLb passing through the corner portion (second corner portion) CI and the center DVO1b of the dummy via (third via) DV1b. On the other hand, in plan view, the via V2 is not on the straight line CLa and the straight line CLb.

Hereinafter, the cross-sectional structures of the semiconductor device SD2a of the second embodiment will be described based on the cross-sectional views of main parts along the line B-B in FIG. 18.

As shown in FIG. 19, in the semiconductor device SD2a of the second embodiment, the dummy interconnection DM2 is formed on the insulating layer IL1 in the area where the device isolation layer EI of the substrate SB is formed. The wiring M2 and the dummy wiring DM2 are formed in the same layer.

As shown in FIG. 19, a through hole is formed in the insulating IL2, and a conductive dummy plug DV1a, DV2b is buried in the through hole. The dummy via DV1a, DV2b is disposed between the wiring M3 and the dummy wiring DM2, and contacts the bottom surface of the wiring M3 and the dummy wiring DM2.

The above points are the difference between the semiconductor device SD2a of the second embodiment and the semiconductor device SD1a of the first embodiment. Since the other configuration of the semiconductor device SD2a of the second embodiment is the same as that of the semiconductor device SD1a of the first embodiment, repeated descriptions are omitted.

First, the crack extends from the corner portion CI to the dummy via DV1a closest to the corner portion CI in the same manner as in the first embodiment. Here, as described above, the crack extending from the corner portion CI to the dummy via DV1a may extend along the straight line CLa passing through the corner portion CI and the center DVO1a of the dummy via DV1a. Therefore, by utilizing this property, the center DVO2a of the dummy via DV2a is arranged on the straight line CLa. The via V2 is not arranged on the straight line CLa. By doing so, it is possible to induce the crack extended to the dummy via DV1a to the dummy via DV2a, and it is possible to prevent the crack from extending to the via V2.

Similarly, the crack extends from the corner portion CI to the dummy via DV1b closest to the corner portion CI. Here, the center DVO2b of the dummy via DV2b is arranged on the straight line CLb. The via V2 is not arranged on the straight line CLb. By doing so, it is possible to induce the crack extended to the dummy via DV1b to the dummy via DV2b, and it is possible to prevent the crack from extending to the via V2.

The distance between the via V2 and the corner portion CI is longer than the distance between the dummy via DV2a, DV2b and the corner portion CI. That is, the distance between the via V2 and the dummy via DV1a is longer than the distance between the dummy via DV2a, DV2b and the dummy via DV1a. Therefore, even if a crack extended to the dummy via DV1a does not extend to the dummy via DV2a, the crack extends to the dummy via DV2b closest to the dummy via DV1a. As a result, the via V2 does not need to be broken.

As described above, in the second embodiment, by arranging the corner portion CI and the dummy via DV1a, DV2a on a straight line, the possibility that the crack extending from the corner portion CI to the dummy via DV1a extends toward the via V2 can be reduced. By arranging the corner portion CI and the dummy via DV1b, DV2b on a straight line, the possibility that a crack extending from the corner portion CI to the dummy via DV1b extends toward the via V2 can be reduced.

The second embodiment is advantageous over the first embodiment in that the layout can be changed freely to some extent if the conditions of arranging the corner portion CI and the dummy via DV1a, DV2a in a straight line and the conditions of arranging the corner portion CI and the dummy via DV1b, DV2b in a straight line are satisfied, respectively. On the other hand, the first embodiment is advantageous over the second embodiment in that, since the distance between the dummy vias is short, it is easy to induce cracks from the dummy vias to the dummy vias, and it is easy to reduce the possibility of extending cracks to the vias.

Figure 20:
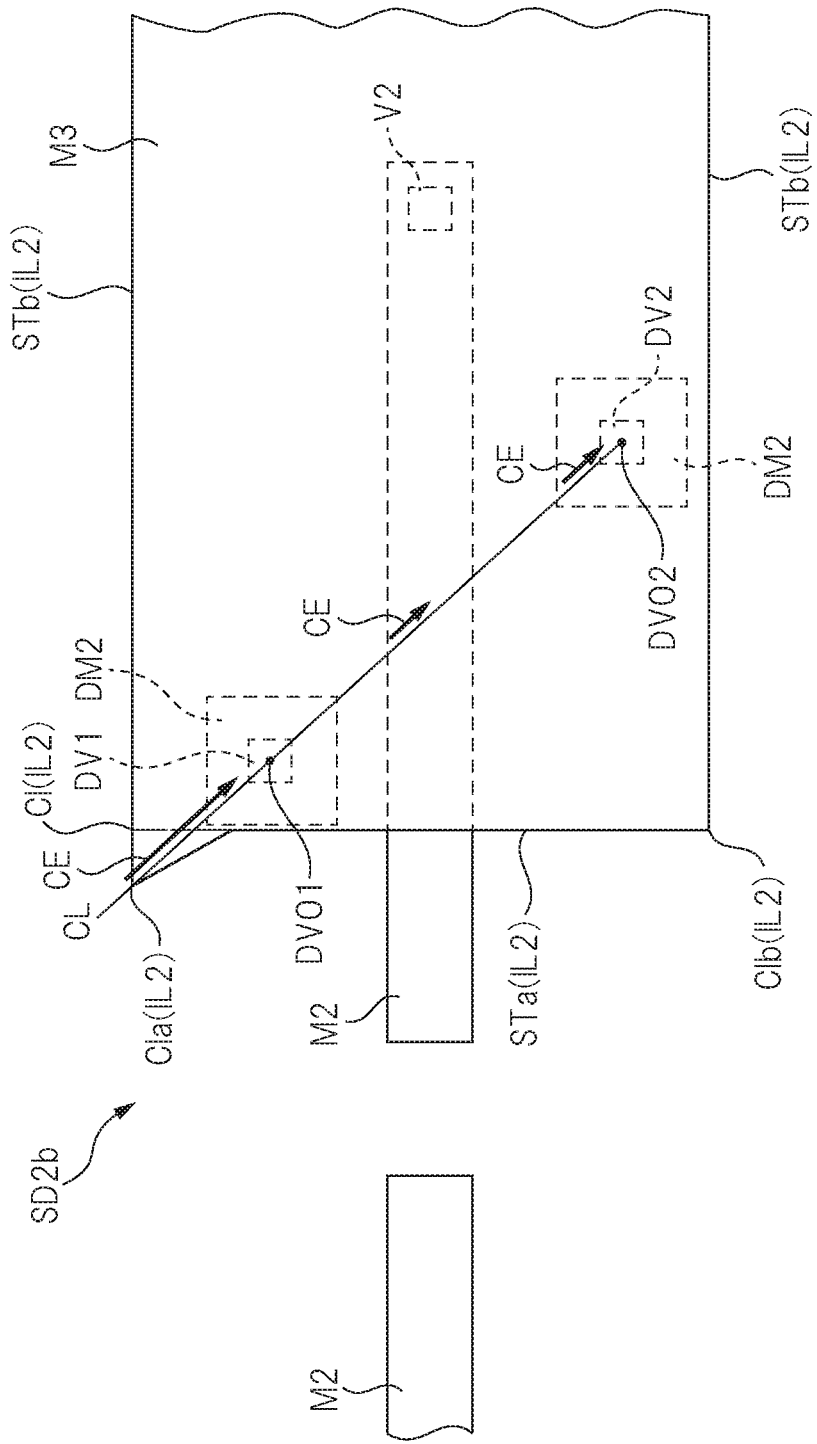
FIG. 20 is an enlarged plan view showing a semiconductor device according to a third modification.

The semiconductor device of the first modification example (hereinafter, modification example 3) of the second embodiment will be described. FIG. 20 is an enlarged plan view showing a semiconductor device SD2b according to a third modification.

As shown in FIG. 20, in the third modification, the corner portion CIa is formed at an acute angle in one of the two corner portions CI of the wire M3 in plan view, and as a result, the corner portion is also formed at an acute angle in the insulating layer IL2. The other corner portion CIb of the wire M3 is not formed at an acute angle, and as a result, the corner portion CIb is not formed at an acute angle even in the insulating layer IL2.

A dummy interconnection DM2 in contact with the dummy via DV1 and the dummy via DV1 is arranged in the vicinity of the corner portion CIa. A dummy via DV2 is arranged on a straight line CL passing through the corner portion CIa and the center DVO1 of the dummy via DV1 so that the center DVO2 of the dummy via DV2 is located.

The above point is a difference between the semiconductor device SD2b of Modification 3 and the semiconductor device SD2a of Embodiment 2. The other configuration of the semiconductor device SD2b of Modification 3 is the same as the configuration of the semiconductor device SD2a of Embodiment 2, and therefore repetitive descriptions are omitted.

As described above, in the second embodiment shown in FIG. 18, the two corner portions CI have the same shape and arrangement in plan view. Therefore, stress strain is equally generated in both corner portions CI, and as a result, the probability that cracks caused by the formation of the wiring M3 are generated from the corner portion CI as a starting point is equal in the two corner portions CI. Therefore, the dummy wiring DM2 in contact with the dummy vias DV1a and DV1a and the dummy wiring DM2 in contact with the dummy vias DV1b and DV1b are symmetrically arranged with a straight line (A-A line) passing through the widthwise center of the wiring M3 interposed therebetween. The dummy wiring DM2 in contact with the dummy vias DV2a and DV2a and the dummy wiring DM2 in contact with the dummy vias DV2b and DV2b are symmetrically arranged with a straight line (A-A line) passing through the widthwise center of the wiring M3 interposed therebetween.

On the other hand, in Modification 3 shown in FIG. 20, since one corner portion CIa is formed at an acute angle in plan view, the magnitude of stress strain generated in the corner portion CIa is larger than that in the other corner portion CIb. Therefore, the probability that the crack caused by the formation of the wiring M3 is generated from the corner portion CIa as a starting point is higher than the probability that the crack is generated from the corner portion CIb as a starting point.

Therefore, in the third modification, the dummy interconnection DM2 in which the dummy via DV1 and the dummy via DV1 are in contact with each other is arranged in the vicinity of the corner portion CIa. The dummy via DV2 is arranged on a straight line CL passing through the corner portion CIa and the center DVO1 of the dummy via DV1. By doing so, it is possible to reliably induce a crack generated from the corner portion CIa as a starting point to the dummy via DV1 closest to the corner portion CIa. Then, similarly to the second embodiment, it is possible to induce a crack from the dummy via DV1 to the dummy via DV2 and prevent the crack from extending to the via V2.

In the third modification, by forming the corner portion CIa at an acute angle, cracks originating from the corner portion CIb are relatively unlikely to occur, so that the dummy interconnection DM2 and the dummy via DV1 do not need to be arranged in the vicinity of the corner portion CIb. In addition, the dummy via DV2 does not need to be arranged on a straight line passing through the corner portion CIb and the dummy via DV1.

As described above, in Modified Example 3, similarly to Embodiment 2, it is possible to prevent a situation in which a crack caused by the formation of the wiring M3 extends to the via V2 and the via V2 breaks to cause an open defect. In Modification 3, since the dummy interconnection DM2 and the dummy via DV1 do not need to be arranged in the vicinity of the corner portion CIb, and the dummy via DV2 does not need to be arranged on a straight line passing through the corner portion CIb and the dummy via DV1, the manufacturing costs can be reduced, which is an advantage over Embodiment 2. On the other hand, the second embodiment has an advantage over the third modification in that, even if a crack is generated from any of the two corner portions CIs as a starting point, a crack can be induced in the dummy via DV1 closest to each of the corner portions CIs, thereby preventing breakage of the via V2.

Figure 21:
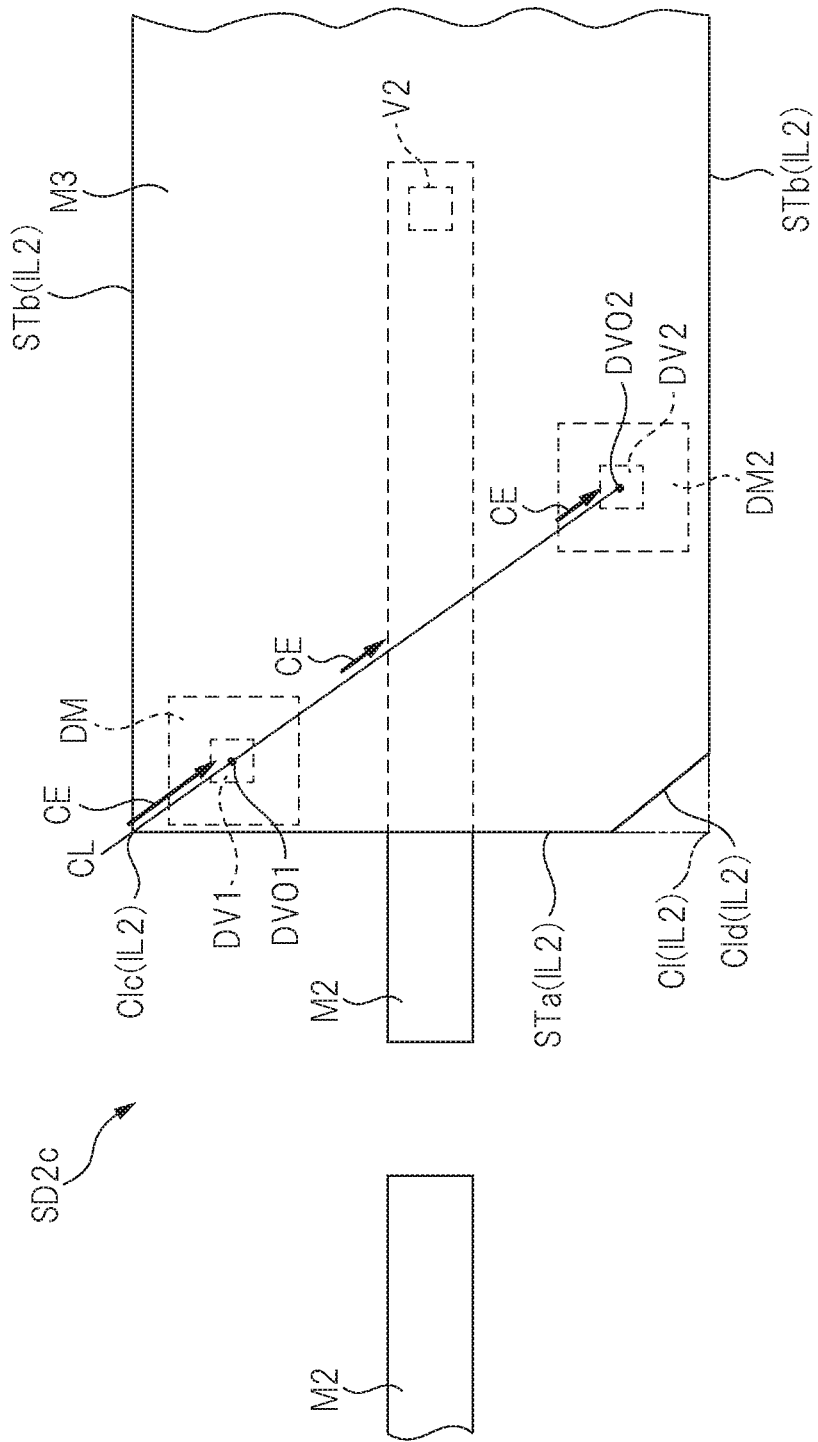
FIG. 21 is an enlarged plan view showing a semiconductor device of a fourth modification example.

The semiconductor device of the second modification example (hereinafter, modification example 4) of the second embodiment 2 will be described. FIG. 21 is an enlarged plan view showing a semiconductor device SD2c according to a fourth modification.

As shown in FIG. 21, in the fourth modification, the corner portion CId is formed at an obtuse angle in one of the two corner portions of the wire M3 in plan view, that is, the corner portion CId is chamfered, and as a result, the corner portion is formed at an obtuse angle in the insulating layer IL2 as well. In particular, in Modification 4, the corner portion CId has a structure in which the corner of the rectangle is recessed inward in plan view. The other corner portion CIc of the wire M 3 is not formed at an obtuse angle, and as a result, the corner portion CIc is not formed at an obtuse angle even in the insulating layer IL2.

A dummy interconnection DM2 in contact with the dummy via DV1 and the dummy via DV1 is arranged in the vicinity of the corner portion CIc. A dummy via DV2 is arranged on a straight line CL passing through the corner portion CIc and the center DVO1 of the dummy via DV1 so that the center DVO2 of the dummy via DV2 is located.

The above point is a difference between the semiconductor device SD2c of the fourth modification and the semiconductor device SD2a of the second embodiment. The other configuration of the semiconductor device SD2c of Modification 4 is the same as the configuration of the semiconductor device SD2a of Embodiment 2, and therefore repetitive descriptions are omitted.

As described above, in the second embodiment shown in FIG. 18, the two corner portions CI have the same shape and arrangement in plan view. Therefore, stress strain is equally generated in both corner portions CI, and as a result, the probability that cracks caused by the formation of the wiring M3 are generated from the corner portion CI as a starting point is equal in the two corner portions CI. Therefore, the dummy wiring DM2 in contact with the dummy vias DV1a and DV1a and the dummy wiring DM2 in contact with the dummy vias DV1b and DV1b are symmetrically arranged with a straight line (A-A line) passing through the widthwise center of the wiring M3 interposed therebetween. The dummy wiring DM2 in contact with the dummy vias DV2a and DV2a and the dummy wiring DM2 in contact with the dummy vias DV2b and DV2b are symmetrically arranged with a straight line (A-A line) passing through the widthwise center of the wiring M3 interposed therebetween.

On the other hand, in Modification 4 shown in FIG. 21, since one corner portion CId is formed at an obtuse angle in plan view, the magnitude of stress strain generated in the corner portion CId is smaller than that in the other corner portion CIc. Therefore, the probability that the crack caused by the formation of the wiring M3 is generated from the corner portion CId as the starting point is lower than the probability that the crack is generated from the corner portion CIc as the starting point.

Therefore, in the fourth modification, the dummy interconnection DM2 in which the dummy via DV1 and the dummy via DV1 are in contact with each other is arranged in the vicinity of the corner portion CIc. The dummy via DV2 is arranged on a straight line CL passing through the corner portion CIc and the center DVO1 of the dummy via DV1. By doing so, it is possible to reliably induce a crack generated from the corner portion CIc as a starting point to the dummy via DV1 closest to the corner portion CIc. Then, similarly to the second embodiment, it is possible to induce a crack from the dummy via DV1 to the dummy via DV2 and prevent the crack from extending to the via V2.

In Modification 4, since cracks originating from the corner portion CId are relatively unlikely to occur by forming the corner portion CId at an obtuse angle, the dummy interconnection DM2 and the dummy via DV1 need not be arranged in the vicinity of the corner portion CId. In addition, the dummy via DV2 does not need to be arranged on a straight line passing through the corner portion CId and the dummy via DV1.

As described above, in Modified Example 4, similarly to Embodiment 2, it is possible to prevent a situation in which a crack caused by the formation of the wiring M3 extends to the via V2 to break the via V2 and cause an open defect. In the fourth modification, since it is unnecessary to arrange the dummy interconnection DM2 and the dummy via DV1 in the vicinity of the corner portion CId and it is unnecessary to arrange the dummy via DV2 on a straight line passing through the corner portion CId and the dummy via DV1, the manufacturing costs can be reduced, which is more advantageous than the second embodiment. On the other hand, the second embodiment has an advantage over the fourth modification in that, even if a crack is generated from any of the two corner portions CIs as a starting point, a crack can be induced in the dummy via DV1 closest to each of the corner portions CIs, thereby preventing breakage of the via V2.

Third Embodiment

Figure 22:
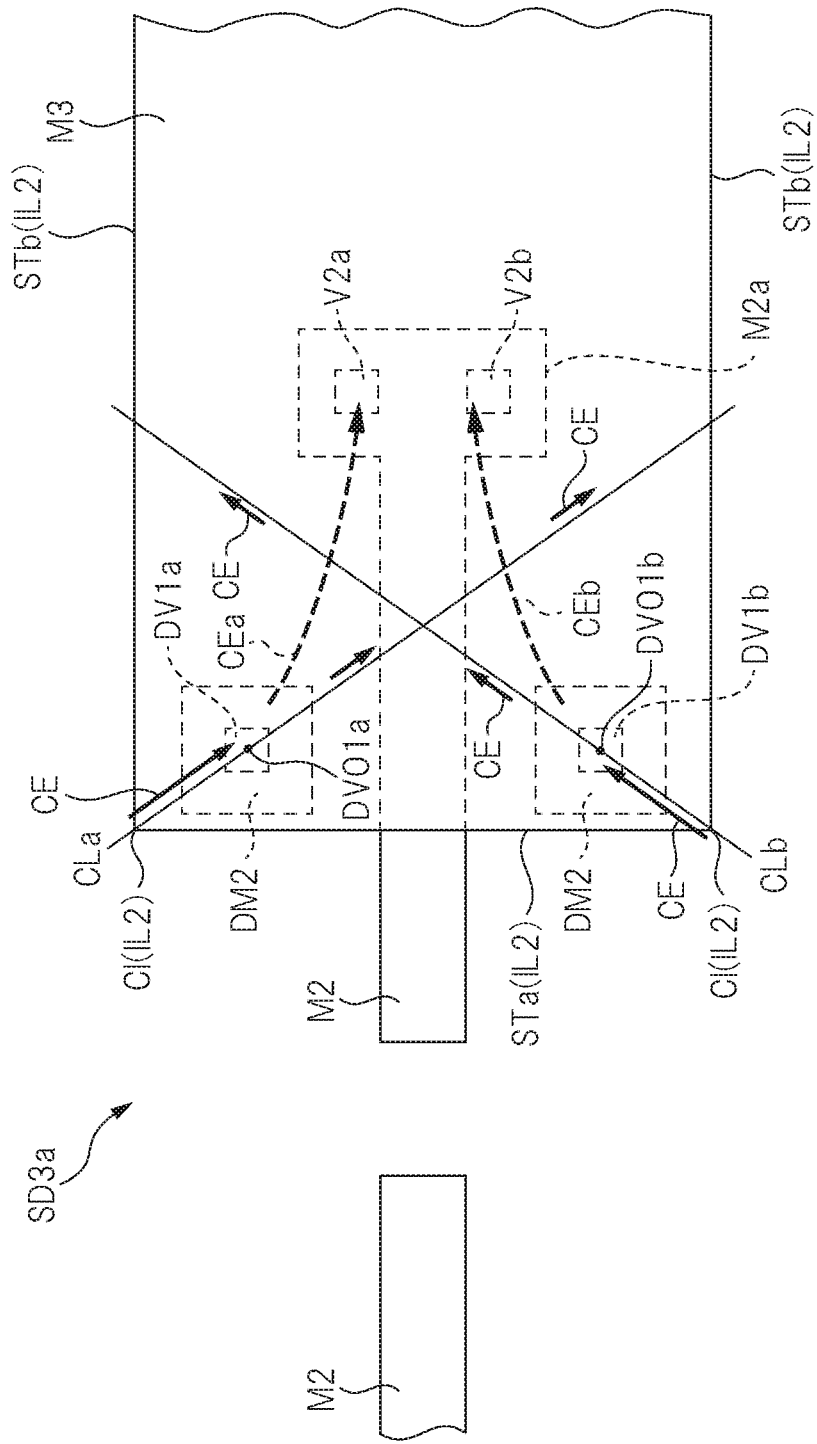
FIG. 22 is an enlarged plan view showing the semiconductor device of the third embodiment.

A semiconductor device according to Embodiment 3 will be described. FIG. 22 is an enlarged plan view showing the SD3a of the semiconductor device according to the third embodiment.

FIG. 22 is an enlarged plan view showing the planar arrangement of the wirings M2, M2a, and M3, the dummy wirings DM2, the vias V2a and V2b, and the dummy vias DV1a, DV1b in the semiconductor device SD3a of the third embodiment, in which other members are omitted.

As shown in FIG. 22, in the semiconductor device SD3a of the third embodiment, a wiring M2a having a width larger than the width of the wiring M2 is formed at one end of the length of the wiring M2. The wiring M2 and the wiring M2a are formed integrally with each other. The vias V2a and V2b are arranged so as to be in contact with the wiring M3 and the wiring M2a.

As shown in FIG. 22, dummy wirings (first conductor patterns) DM2 are formed at both ends of the widthwise direction of the wiring M3 along the length direction of the wiring M3 in plan view. The dummy vias DV1a, DV1b are arranged so as to respectively touch the bottom surface of the wiring M3 and the top surface of the dummy wiring DM2.

The dummy wiring DM2 in contact with the dummy vias DV1$a$ and DV1$a$ and the dummy wiring DM2 in contact with the dummy vias DV1$b$ and DV1$b$ are symmetrically arranged with a straight line (A-A line) passing through the widthwise center of the wiring M3 interposed therebetween.

The distance between the via V2$a$ and the corner portion CI is longer than the distance between the dummy via DV1$a$ and the corner portion CI. Also, the distance between the via (sixth via) V2$b$ and the corner portion CI is longer than the distance between the dummy via DV1$b$ and the corner portion CI.

In plan view, the vias V2$a$ and V2$b$ are not on the straight line CLa connecting the corner portion (first corner portion) CI and the center DVO1$a$ of the dummy via (second via) DV1$a$ and on the straight line CLb connecting the corner portion (second corner portion) CI and the center DVO1$b$ of the dummy via (third via) DV1$b$.

The above points are the difference between the semiconductor device SD3$a$ of the third embodiment and the semiconductor device SD1$a$ of the first embodiment. The other configuration of the semiconductor device SD3$a$ of the third embodiment is the same as that of the semiconductor device SD1$a$ of the first embodiment, and therefore repetitive descriptions are omitted.

First, the crack extends from the corner portion CI to the dummy via DV1$a$ closest to the corner portion CI in the same manner as in Embodiments 1 and 2. Here, as described above, the crack extending from the corner portion CI to the dummy via DV1$a$ may extend along the straight line CLa passing through the corner portion CI and the center DVO1$a$ of the dummy via DV1$a$. Similarly, a crack extending from the corner portion CI to the dummy via DV1$b$ may extend along a straight line CLb passing through the corner portion CI and the center DVO1$b$ of the dummy via DV1$b$.

Therefore, similar to the above-described second embodiment, the via V2$a$ and V2$b$ are not disposed on the linear CLa using this property. By doing so, it is possible to prevent the crack extended to the dummy via DV1$a$ from extending to the vias V2$a$ and V2$b$. Similarly, the vias V2$a$ and V2$b$ are not arranged on the straight line CLb. By doing so, it is possible to prevent the crack extended to the dummy via DV1$b$ from extending to the vias V2$a$ and V2$b$.

Here, the third embodiment does not have a dummy via corresponding to the dummy via DV2$a$, DV2$b$ of the second embodiment. On the other hand, the vias V2$a$ and V2$b$ connecting the wiring M3 and the wiring M2 are provided. Therefore, there is a possibility that the crack extended in the dummy via DV1$a$ extends to the via V2$a$ close to the dummy via DV1$a$ along the arrow CEa, but even if the via V2$a$ is broken by this crack, the via V2$b$ survives. Similarly, a crack extending in the dummy via DV1$b$ may extend to the via V2$b$ near the dummy via DV1$b$ along arrow CEb, but if the via V2$b$ breaks due to this crack, the via V2$a$ will survive. Therefore, it is possible to prevent conduction failure between the wirings due to cracks.

As described above, in the third embodiment, by arranging the corner portion CI and the dummy via DV1$a$, DV2$a$ on a straight line, the possibility that the crack extending from the corner portion CI to the dummy via DV1$a$ extends toward the via V2 can be reduced. By arranging the corner portion CI and the dummy via DV1$b$, DV2$b$ on a straight line, the possibility that a crack extending from the corner portion CI to the dummy via DV1$b$ extends toward the via V2 can be reduced.

Embodiment 3 is advantageous over Embodiments 1 and 2 in that only the dummy vias DV1$a$, DV1$b$ are arranged in the vicinity of the corner portions CIs, and the layouts of other layouts are highly flexible. On the other hand, the first embodiment is advantageous over the third embodiment in that, since the distance between the dummy vias is short, it is easy to induce cracks from the dummy vias to the dummy vias, and it is easy to reduce the possibility of extending cracks to the vias. Further, the second embodiment is advantageous over the third embodiment in that, by arranging the corner portions and the plurality of dummy vias on a straight line, cracks can be easily induced from the dummy vias to the dummy vias, and the possibility of the cracks extending to the vias can be easily reduced.

Figure 23:
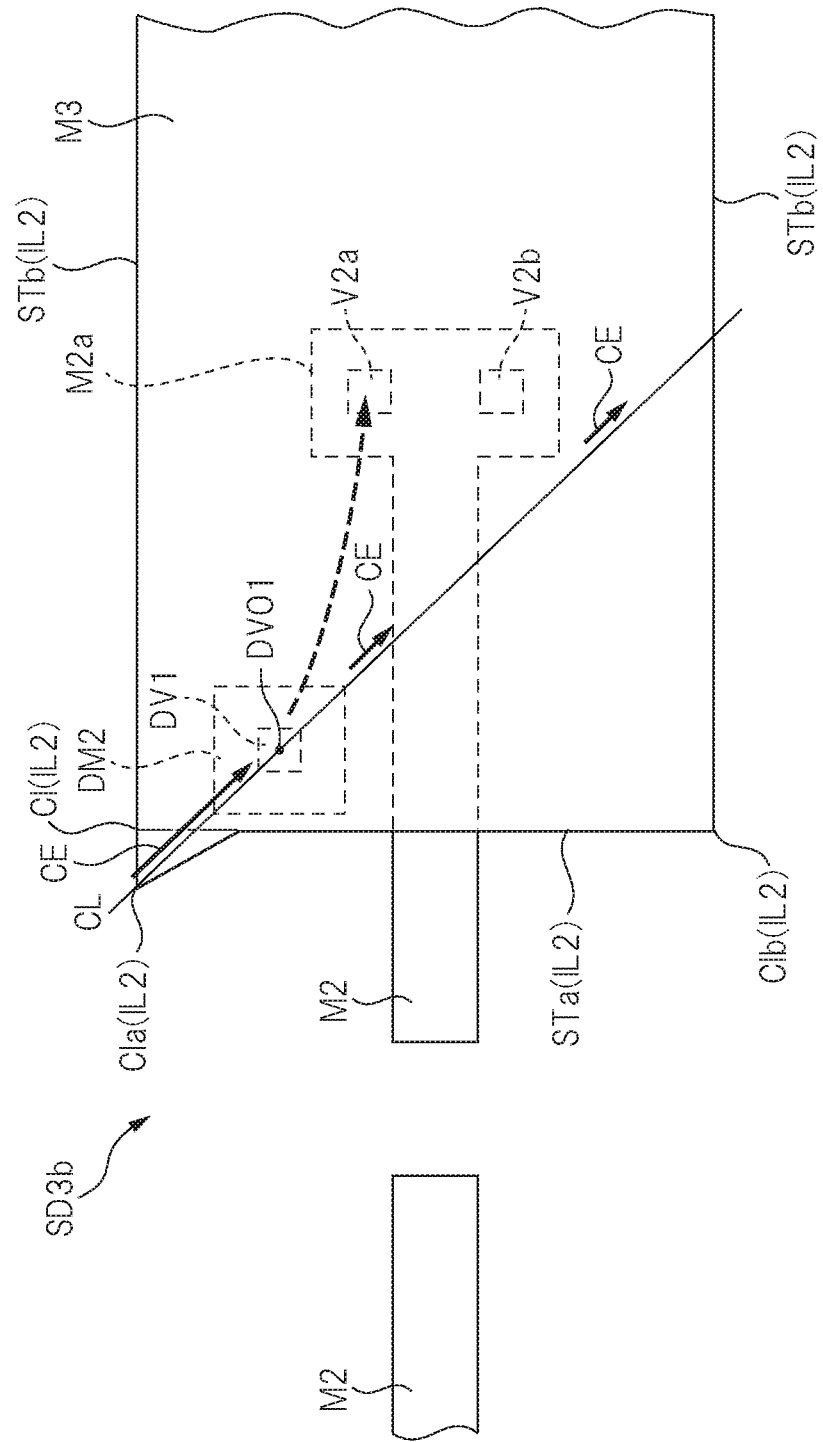
FIG. 23 is an enlarged plan view showing a semiconductor device according to a fifth modification.

The semiconductor device of the first modification example (hereinafter, modification example 5) of the third embodiment will be described. FIG. 23 is an enlarged plan view showing the SD3$b$ of the semiconductor device according to the fifth modification.

As shown in FIG. 23, in the fifth modification, the corner portion CIa is formed at an acute angle in one of the two corner portions CI of the wire M3 in plan view, and as a result, the corner portion is also formed at an acute angle in the insulating layer IL2. The other corner portion CIb of the wire M3 is not formed at an acute angle, and as a result, the corner portion CIb is not formed at an acute angle even in the insulating layer IL2.

The above point is a difference between the semiconductor device SD3$b$ of Modification 5 and the semiconductor device SD3$a$ of Embodiment 3. Since the other configuration of the semiconductor device SD3$b$ of the modification 5 is the same as the configuration of the semiconductor device SD3$a$ of the embodiment 3, repetitive descriptions are omitted.

As described above, in the third embodiment shown in FIG. 22, the two corner portions CI have the same shape and arrangement in plan view. Therefore, stress strain is equally generated in both corner portions CI, and as a result, the probability that cracks caused by the formation of the wiring M3 are generated from the corner portion CI as a starting point is equal in the two corner portions CI. Therefore, the dummy wiring DM2 in contact with the dummy vias DV1$a$ and DV1$a$ and the dummy wiring DM2 in contact with the dummy vias DV1$b$ and DV1$b$ are symmetrically arranged with a straight line (A-A line) passing through the widthwise center of the wiring M3 interposed therebetween.

On the other hand, in the modification 5 shown in FIG. 23, one corner portion CIa is formed at an acute angle in plan view, and therefore, the magnitude of the stress strain generated in the corner portion CIa is larger than that in the other corner portion CIb. Therefore, the probability that the crack caused by the formation of the wiring M3 is generated from the corner portion CIa as a starting point is higher than the probability that the crack is generated from the corner portion CIb as a starting point.

Therefore, in Modification 5, the dummy interconnection DM2 in which the dummy via DV1 and the dummy via DV1 are in contact with each other is arranged in the vicinity of the corner portion CIa. By doing so, it is possible to reliably induce a crack generated from the corner portion CIa as a starting point to the dummy via DV1 closest to the corner portion CIa.

Further, in the fifth modification, as in the third embodiment, the vias V2$a$ and V2$b$ are not disposed on the linear CL. By doing so, it is possible to prevent the crack extended to the dummy via DV1 from extending to the vias V2$a$ and V2$b$.

In the fifth modification, as in the third embodiment, the vias V2a and V2b connecting the wiring M3 and the wiring M2 are provided. Therefore, there is a possibility that a crack extended in the dummy via DV1 extends to the via V2a close to the dummy via DV1 along the arrow CE, but the via V2b survives even if the via V2a is broken by the crack. Therefore, it is possible to prevent conduction failure between the wirings due to cracks.

In Modification 5, by forming the corner portion CIa at an acute angle, cracks originating from the corner portion CIb are relatively unlikely to occur, so that the dummy interconnection DM2 and the dummy via DV1 do not need to be arranged in the vicinity of the corner portion CIb.

Thus, in the fifth modification, as in the third embodiment, it is possible to prevent the crack caused by the formation of the wiring M3 from extending to the via V2a and V2b, causing the via V2a and V2b to break and become an open failure.

In the fifth modification, since the dummy interconnection DM2 and the dummy via DV1 do not need to be arranged in the vicinity of the corner portion CIb, the manufacturing costs can be reduced, which is an advantage over the third embodiment. On the other hand, the third embodiment is advantageous over the fifth embodiment in that even if cracks are generated from any of the two corner portions CI, cracks can be induced in the dummy via DV1a, DV1b closest to each other to prevent breakage of the vias V2a and V2b.

Figure 24:
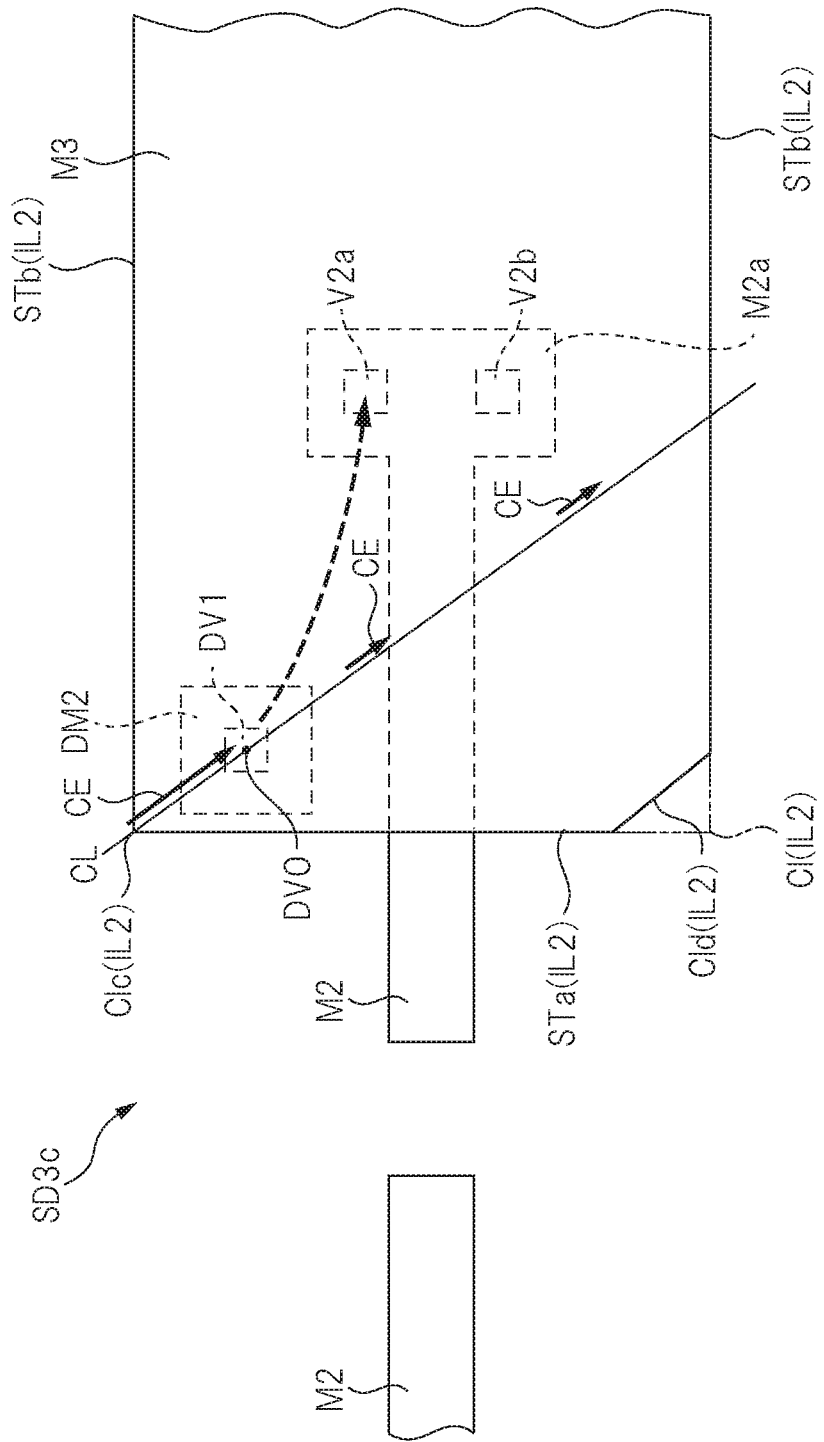
FIG. 24 is an enlarged plan view showing a semiconductor device according to a sixth modification.

The semiconductor device of the second modification example (hereinafter, modification example 6) of the third embodiment will be described. FIG. 24 is an enlarged plan view showing the SD3c of the semiconductor device according to the sixth modification.

As shown in FIG. 24, in Modification 6, the corner portion CId is formed at an obtuse angle in one of the two corner portions of the wire M3 in plan view, that is, the corner portion CId is chamfered, and as a result, the corner portion is also formed at an obtuse angle in the insulating layer IL2. In particular, in Modification 6, the corner portion CId has a structure in which the corner of the rectangle is recessed inward in plan view. The other corner portion CIc of the wire M3 is not formed at an obtuse angle, and as a result, the corner portion CIc is not formed at an obtuse angle even in the insulating layer IL2.

A dummy interconnection DM2 in contact with the dummy via DV1 and the dummy via DV1 is arranged in the vicinity of the corner portion CIc.

The above point is a difference between the semiconductor device SD3c of Modification 6 and the semiconductor device SD3a of Embodiment 3. Since the other configuration of the semiconductor device SD3c of Modification 6 is the same as the configuration of the semiconductor device SD3a of Embodiment 3, repeated descriptions are omitted.

As described above, in the third embodiment shown in FIG. 22, the two corner portions CI have the same shape and arrangement in plan view. Therefore, stress strain is equally generated in both corner portions CI, and as a result, the probability that cracks caused by the formation of the wiring M3 are generated from the corner portion CI as a starting point is equal in the two corner portions CI. Therefore, the dummy wiring DM2 in contact with the dummy vias DV1a and DV1a and the dummy wiring DM2 in contact with the dummy vias DV1b and DV1b are symmetrically arranged with a straight line (A-A line) passing through the widthwise center of the wiring M3 interposed therebetween.

On the other hand, in the modification 6 shown in FIG. 24, since one corner portion CId is formed at an obtuse angle in plan view, the magnitude of stress strain generated in the corner portion CId is smaller than that in the other corner portion CIc. Therefore, the probability that the crack caused by the formation of the wiring M3 is generated from the corner portion CId as the starting point is lower than the probability that the crack is generated from the corner portion CIc as the starting point.

Therefore, in the sixth modification, the dummy interconnection DM2 in which the dummy via DV1 and the dummy via DV1 are in contact with each other is arranged in the vicinity of the corner portion CIc. By doing so, it is possible to reliably induce a crack generated from the corner portion CIc as a starting point to the dummy via DV1 closest to the corner portion CIc.

In Modification 6, the vias V2a and V2b are not arranged on the straight line CL as in Embodiment 3. By doing so, it is possible to prevent the crack extended to the dummy via DV1 from extending to the vias V2a and V2b.

In Modification 6, similarly to Embodiment 3, vias V2a and V2b for connecting the wiring M3 and the wiring M2 are provided. Therefore, there is a possibility that a crack extended in the dummy via DV1 extends to the via V2a close to the dummy via DV1 along the arrow CE, but the via V2b survives even if the via V2a is broken by the crack. Therefore, it is possible to prevent conduction failure between the wirings due to cracks.

Further, in Modification 6, by forming the corner portion CId at an obtuse angle, cracks originating from the corner portion CId are relatively unlikely to occur, so that the dummy interconnection DM2 and the dummy via DV1 do not need to be arranged in the vicinity of the corner portion CId.

As described above, in Modified Example 6, similarly to Embodiment 3, it is possible to prevent a situation in which a crack caused by the formation of the wiring M3 extends to the vias V2a and V2b, breaking the vias V2a and V2b, and causing an open defect.

In the sixth modification, since the dummy interconnection DM2 and the dummy via DV1 do not need to be arranged in the vicinity of the corner portion CId, the manufacturing costs can be reduced, which is an advantage over the third embodiment. On the other hand, the third embodiment has an advantage over the sixth modification in that, even if a crack is generated from any of the two corner portions CIs as a starting point, a crack can be induced in the dummy via DV1a, DV1b closest to each of the corner portions CIs, thereby preventing breakage of the vias V2a and V2b.

Although the invention made by the present inventor has been specifically described based on the embodiment, the present invention is not limited to the embodiment described above, and it is needless to say that various modifications can be made without departing from the gist thereof.

In addition, what corresponds to the contents described in the embodiments or a part thereof will be described below.

Appendix 1

A method of manufacturing a semiconductor device comprising the step of:
(a) preparing a substrate;
(b) forming a first insulating film on the substrate;
(c) forming a first conductive film on the first insulating film after the step (b);
(d) etching the first conductive film to form a first wiring and a first conductive pattern after the step (c);

(e) forming a second insulating film to cover the first wiring and the first conductive pattern after the step (d);

(f) forming a first opening reaching the first wiring and a plurality of second openings reaching the first conductive pattern in the second insulating film after the step (e);

(g) forming a first via in the first opening and forming a plurality of second vias in each of the plurality of second openings after the step (f);

(h) forming a second via in the first opening and forming a plurality of second vias in each of the plurality of second openings after the step (g) forming a thicker conductive film on the first conductive film after the step (g);

(i) forming a thicker second conductive film on the second conductive film after the step (h) forming a thicker conductive film than the second conductive pattern; forming a second wiring by etching the second conductor film; wherein the first wiring and the second wiring are each formed in a rectangular shape in plan view; wherein the second wiring is thicker than the first wiring; wherein a first distance between a second via closest to a first corner portion of the second wiring among the plurality of second vias is shorter than a second distance between the first via and the first corner portion; and wherein a third distance between second vias adjacent to each other among the plurality of second vias is shorter than a fourth distance between a second via closest to the first via and the first via among the plurality of second vias in plan view.

Appendix 2

In the method for manufacturing a semiconductor device according to Appendix 1, in the step (i), a region of the second insulating film that does not overlap the second wiring is over-etched in plan view, and the thickness of the second insulating film is thinner in the second region that does not overlap the second wiring in plan view than in the first region which overlaps the second wiring in plan view.

Appendix 3

(a) preparing a substrate; (b) forming a first insulating film on the substrate; (c) forming a first conductive film on the first insulating film after the step (b); (d) etching the first conductive film to form a first wiring and a first conductive pattern; (e) forming a second insulating film to cover the first wiring and the first conductive pattern after the step (d); (f) forming a first opening reaching the first wiring and a second opening reaching the first conductive pattern in the second insulating film after the step (e); (g) forming a first via in the first opening and forming a second via in the second opening after the step (f); (h) forming a second via in the second opening after the step (g) forming a second conductive film thicker than the first conductive film on the second conductive film after the step (g); (h) forming a second conductive film thicker than the first conductive film on the second conductive film after the step (g); A method of manufacturing a semiconductor device, comprising: forming a second wiring; wherein the first wiring and the second wiring are each formed in a rectangular shape in plan view; wherein the second wiring is thicker than the first wiring; wherein a distance between a first corner portion of the second wiring and the first via is longer than a distance between the first corner portion and the second via; and wherein the first via is not on a straight line passing through the first corner portion and the second via in plan view.

Appendix 4

In the method for manufacturing a semiconductor device according to Appendix 3, in the step (i), a region of the second insulating film that does not overlap the second wiring is over-etched in plan view, and the thickness of the second insulating film is thinner in the second region that does not overlap the second wiring in plan view than in the first region that overlaps the second wiring in plan view.

What is claimed is:

1. A semiconductor device comprising:
   a semiconductor substrate;
   a plurality of wiring layers formed on the semiconductor substrate;
   a first wiring formed in a first wiring layer of the plurality of wiring layers;
   a second wiring formed in a second wiring layer, the second wiring layer being a wiring layer that is formed one above the first wiring layer within the plurality of wiring layers;
   a first insulating layer disposed between the first wiring layer and the second wiring layer;
   a first conductor pattern formed in the first wiring layer;
   a first via that is in contact with the first wiring and the second wiring to electrically connect the first wiring and the second wiring; and
   a plurality of second vias that are in contact with the first wiring and the second wiring,
   wherein the first wiring and the second wiring are each formed in a rectangular shape in plan view,
   wherein the second wiring is thicker than the first wiring,
   wherein, in plan view, a first distance between A) a second via, of the plurality of the second vias, that is closest to a first corner portion of the second wiring and B) the first corner portion is shorter than a second distance between A) the first via and B) the first corner portion,
   wherein, in plan view, a third distance between two second vias, of the plurality of the second vias, that are adjacent to each other is shorter than a fourth distance between A) a second via, of the plurality of the second vias, that is closest to the first via and B) the first via, and
   wherein a thickness of a second region, of the first insulating layer, that does not overlap the second wiring in plan view is thinner than a thickness of a first region, of the first insulating layer, that overlaps the second wiring in plan view.

2. The semiconductor device according to claim 1, wherein a fifth distance between a second via that is farthest from the first corner portion of the plurality of second vias and the first corner portion is greater than the second distance between the first via and the first corner portion.

3. The semiconductor device according to claim 1, wherein the plurality of second vias are arranged along a length direction of the second wiring.

4. The semiconductor device according to claim 1, wherein the first conductor pattern and the first wiring are not in contact with each other.

5. The semiconductor device according to claim 1, further comprising:
   a second conductor pattern formed in the first wiring layer; and
   a plurality of third vias in contact with the second conductor pattern and the second wiring,
   wherein, in plan view, a sixth distance between A) a third via, of the plurality of the third vias, that is closest to a second corner of the second wiring and B) the second corner is shorter than a seventh distance between A) the first via and B) the second corner portion, and
   wherein, in plan view, an eighth distance between two third vias, of the plurality of third vias, adjacent to each other is shorter than a ninth distance between A) a third via, of the plurality of the third vias, that is closest to the first via and B) the first via.

6. The semiconductor device according to claim 5, wherein the second conductor pattern is arranged symmetrically with respect to the first conductor pattern with a straight line passing through a center of the second wiring in a width direction in a plan view, and wherein each of the plurality of third vias is arranged symmetrically with respect to the plurality of second vias across the straight line in the plan view.

* * * * *